(12) United States Patent
Stroebe et al.

(10) Patent No.: US 11,840,188 B2
(45) Date of Patent: *Dec. 12, 2023

(54) VEHICLE INTERIOR COMPONENT

(71) Applicant: Shanghai Yanfeng Jinqiao Automotive Trim Systems Co. Ltd., Novi, MI (US)

(72) Inventors: Jennifer A Stroebe, Holland, MI (US); Michael G. Zimmer, Belmont, MI (US)

(73) Assignee: Shanghai Yanfeng Jinqiao Automotive Trim Systems Co. Ltd., Novi, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/592,971

(22) Filed: Feb. 4, 2022

(65) Prior Publication Data

US 2022/0153220 A1 May 19, 2022

Related U.S. Application Data

(63) Continuation-in-part of application No. 17/006,213, filed on Aug. 28, 2020, now Pat. No. 11,325,290, (Continued)

(51) Int. Cl.
*B60R 21/205* (2011.01)
*B60R 21/2165* (2011.01)
*B60R 13/02* (2006.01)

(52) U.S. Cl.
CPC ........ *B60R 21/205* (2013.01); *B60R 13/0256* (2013.01); *B60R 21/2165* (2013.01)

(58) Field of Classification Search
CPC .. B60R 2021/21537; B60R 2021/2161; B60R 13/0256; B60R 21/205; B60R 2013/0287;
(Continued)

(56) References Cited

U.S. PATENT DOCUMENTS 5,429,784 A * 7/1995 Iannazzi ............. B29C 37/0057
264/126
5,873,318 A * 2/1999 Bohlinger ............... D05B 23/00
112/475.08
(Continued)

FOREIGN PATENT DOCUMENTS

CN 103338979 A 10/2013
DE 10 2008 042657 A1 4/2010

OTHER PUBLICATIONS

First Office Action received for Chinese Patent Application Serial No. 201980038464.2 dated Jun. 29, 2022, 23 pages.
(Continued)

*Primary Examiner* — Paul N Dickson
*Assistant Examiner* — Timothy Wilhelm
(74) *Attorney, Agent, or Firm* — Amin, Turocy & Watson, LLP

(57) ABSTRACT

A component for a vehicle interior configured to provide a moveable panel/door is disclosed. The component may comprise a structural substrate and a reinforcement for the panel at a hinge area. The reinforcement may comprise a stitch pattern to reinforce the hinge area during movement of the panel. The stitch pattern may comprise thread sewn into the structural substrate. The stitch pattern may be pressed into a surface of the structural substrate. The structural substrate may comprise a compression-formed component, a generally rigid fiber mat, or a fiber panel. The stitch pattern may be concealed at an exterior surface of the component by a cover. The component may comprise at least one of an instrument panel, a door panel, a trim panel, a trim component, etc. A vehicle interior/trim component comprising a structural substrate with a reinforcement to provide a door/opening for airbag deployment is also disclosed.

20 Claims, 19 Drawing Sheets

Related U.S. Application Data which is a continuation of application No. PCT/US2019/039587, filed on Jun. 27, 2019.

(60) Provisional application No. 62/691,595, filed on Jun. 28, 2018.

(58) Field of Classification Search
CPC .......... B60R 2021/2172; B60R 21/215; B29L 2031/3038; B29C 45/14786; B29C 37/0057; B29C 43/003; B29C 43/203; B29C 45/005; B29C 45/0081; B29C 45/14336; B29C 43/18; B29C 43/52; B29C 2043/181; B29K 2105/04; B29K 2105/20

See application file for complete search history.

(56) References Cited

U.S. PATENT DOCUMENTS

| | | | | |
|---|---|---|---|---|
| 6,076,246 A * | 6/2000 | McCooey | ............ | B29C 44/383 |
| | | | | 264/261 |
| 6,187,411 B1 * | 2/2001 | Palmer | ................ | B29C 70/543 |
| | | | | 428/102 |
| 6,726,239 B1 * | 4/2004 | Teranishi | ............ | B60R 21/2165 |
| | | | | 280/728.3 |
| 6,845,725 B2 * | 1/2005 | Takei | .................. | B60N 2/5883 |
| | | | | 112/470.27 |
| 6,962,120 B1 * | 11/2005 | Fujikura | ................ | D05B 1/12 |
| | | | | 112/475.17 |
| 6,997,126 B2 * | 2/2006 | Murley | .................. | B60N 2/58 |
| | | | | 112/470.27 |
| 7,100,941 B2 * | 9/2006 | Riha | ........................ | B29C 59/16 |
| | | | | 280/728.3 |
| 7,234,726 B2 * | 6/2007 | Trevino | .............. | B60R 21/2165 |
| | | | | 280/728.3 |
| 7,353,669 B2 * | 4/2008 | Ternon | ................. | D04B 21/14 |
| | | | | 280/728.1 |
| 7,464,958 B2 * | 12/2008 | Kong | ................. | B29C 45/0081 |
| | | | | 280/728.3 |
| 7,681,917 B2 * | 3/2010 | Guillo | ...................... | C09J 7/35 |
| | | | | 280/743.2 |
| 7,748,732 B2 * | 7/2010 | Sella | ..................... | B60R 21/201 |
| | | | | 280/728.3 |
| 7,878,528 B2 * | 2/2011 | Dorn | ..................... | B60R 21/216 |
| | | | | 280/728.3 |
| 7,918,480 B2 * | 4/2011 | Kwon | .................. | B60R 21/214 |
| | | | | 280/728.2 |
| 7,918,481 B2 * | 4/2011 | Ohgo | .................. | B60R 21/2165 |
| | | | | 280/728.3 |
| 7,922,956 B1 * | 4/2011 | Scheidmantel | ......... | B29C 44/18 |
| | | | | 264/294 |
| 8,096,577 B2 * | 1/2012 | Roring | ................ | B60R 21/2165 |
| | | | | 280/728.3 |
| 8,100,070 B2 * | 1/2012 | Boinais | .................... | B60N 2/58 |
| | | | | 112/475.08 |
| 8,157,289 B2 * | 4/2012 | Bittner | ................ | B60R 21/2165 |
| | | | | 280/728.3 |
| 8,316,785 B2 * | 11/2012 | Boinais | .................... | D05B 1/08 |
| | | | | 112/166 |
| 8,348,303 B1 * | 1/2013 | Roring | ................. | B60R 21/216 |
| | | | | 280/728.3 |
| 8,376,395 B2 * | 2/2013 | Ory | ....................... | B60R 21/215 |
| | | | | 280/728.3 |
| 8,500,158 B2 * | 8/2013 | Ory | ....................... | B60R 21/216 |
| | | | | 280/728.3 |
| 8,506,865 B2 * | 8/2013 | Wangenheim | ........ | D03D 25/005 |
| | | | | 264/258 |
| 8,530,028 B2 * | 9/2013 | Smith | ..................... | B29C 43/18 |
| | | | | 428/102 |
| 8,657,328 B2 * | 2/2014 | Ory | ........................ | B60R 21/205 |
| | | | | 280/728.3 |
| 8,833,829 B2 * | 9/2014 | Wenzel | .................. | D05B 95/00 |
| | | | | 296/1.08 |
| 8,877,317 B2 * | 11/2014 | Zellner, Jr. | ................. | B32B 7/08 |
| | | | | 428/102 |
| 8,919,270 B2 * | 12/2014 | Wenzel | .................. | D05B 57/32 |
| | | | | 112/470.27 |
| 8,943,985 B2 * | 2/2015 | Hashimoto | ............ | D05B 65/06 |
| | | | | 112/475.17 |
| 8,955,872 B2 * | 2/2015 | Ory | ........................ | B60R 21/215 |
| | | | | 280/728.3 |
| 9,010,801 B2 * | 4/2015 | Baudart | ................ | B60R 21/205 |
| | | | | 280/728.3 |
| 9,045,106 B2 * | 6/2015 | Pauthier | .................. | B29C 45/14 |
| 9,090,222 B2 * | 7/2015 | Roring | .................. | B60R 21/215 |
| 9,228,383 B2 * | 1/2016 | Svatos | ...................... | E05D 1/02 |
| 9,266,480 B2 * | 2/2016 | Fujita | .................... | B60R 21/205 |
| 9,279,641 B1 * | 3/2016 | Springsteen | ........... | F41H 5/0471 |
| 9,296,354 B1 * | 3/2016 | Preisler | ................. | B60R 21/215 |
| 9,297,100 B1 * | 3/2016 | Wu | .......................... | D05B 93/02 |
| 9,340,912 B2 * | 5/2016 | Wenzel | .................. | B60N 2/5891 |
| 9,387,820 B2 * | 7/2016 | Jordan | .................. | B60R 21/215 |
| 9,566,763 B2 * | 2/2017 | Wenzel | .................... | B32B 5/06 |
| 9,809,176 B2 * | 11/2017 | Wenzel | .................... | D05C 7/04 |
| 9,879,366 B2 * | 1/2018 | Toda | ...................... | D05B 15/04 |
| 9,988,010 B2 * | 6/2018 | Aust | ...................... | B60R 21/215 |
| 10,081,327 B2 * | 9/2018 | Toda | .................. | B60R 21/2165 |
| 10,160,415 B2 * | 12/2018 | Choi | ...................... | B60R 21/215 |
| 10,926,732 B2 * | 2/2021 | Sterne Stroebe | ... | B60R 13/0256 |
| 11,052,635 B2 * | 7/2021 | Fujiwara | ................. | B32B 27/32 |
| 2005/0269804 A1 * | 12/2005 | Yamada | .................. | B29C 66/54 |
| | | | | 280/728.3 |
| 2006/0107701 A1 * | 5/2006 | Ternon | ................. | D04B 21/165 |
| | | | | 66/195 |
| 2009/0026740 A1 | 1/2009 | Dorn | | |
| 2009/0217484 A1 * | 9/2009 | Bittner | ................ | B60R 21/2165 |
| | | | | 16/223 |
| 2009/0283993 A1 * | 11/2009 | Finch | ...................... | B60K 37/00 |
| | | | | 280/732 |
| 2009/0315303 A1 | 12/2009 | Ettinger | | |
| 2010/0196686 A1 * | 8/2010 | Van Dam | ................. | B32B 5/022 |
| | | | | 428/219 |
| 2010/0308566 A1 | 12/2010 | Roring et al. | | |
| 2014/0134391 A1 * | 5/2014 | Lumb | ..................... | B32B 5/024 |
| | | | | 428/102 |
| 2014/0361519 A1 | 12/2014 | Roring | | |
| 2016/0280174 A1 | 9/2016 | Aust | | |
| 2017/0036638 A1 | 2/2017 | Cowelchuk et al. | | |
| 2017/0050606 A1 * | 2/2017 | Asakuma | ............ | B60R 21/2165 |
| 2018/0079371 A1 * | 3/2018 | Iwasaki | .................. | D05B 23/00 |
| 2018/0079372 A1 | 3/2018 | Iwasaki et al. | | |
| 2018/0201218 A1 * | 7/2018 | Zhang | ................. | B60R 13/0256 |
| 2018/0207843 A1 * | 7/2018 | Fujiwara | ................. | B29C 41/18 |
| 2018/0251094 A1 | 9/2018 | Aust | | |
| 2019/0016242 A1 * | 1/2019 | Kato | ......................... | B32B 1/00 |
| 2020/0079054 A1 * | 3/2020 | Fujiwara | ................. | B32B 5/024 |
| 2020/0139651 A1 * | 5/2020 | Guha | ..................... | B29B 11/16 |
| 2021/0245680 A1 * | 8/2021 | Czerkas | .................. | B32B 37/06 |

OTHER PUBLICATIONS

Extended European Search Report received for European Application No. 19825348.6 dated Feb. 15, 2022, 8 pages.

* cited by examiner

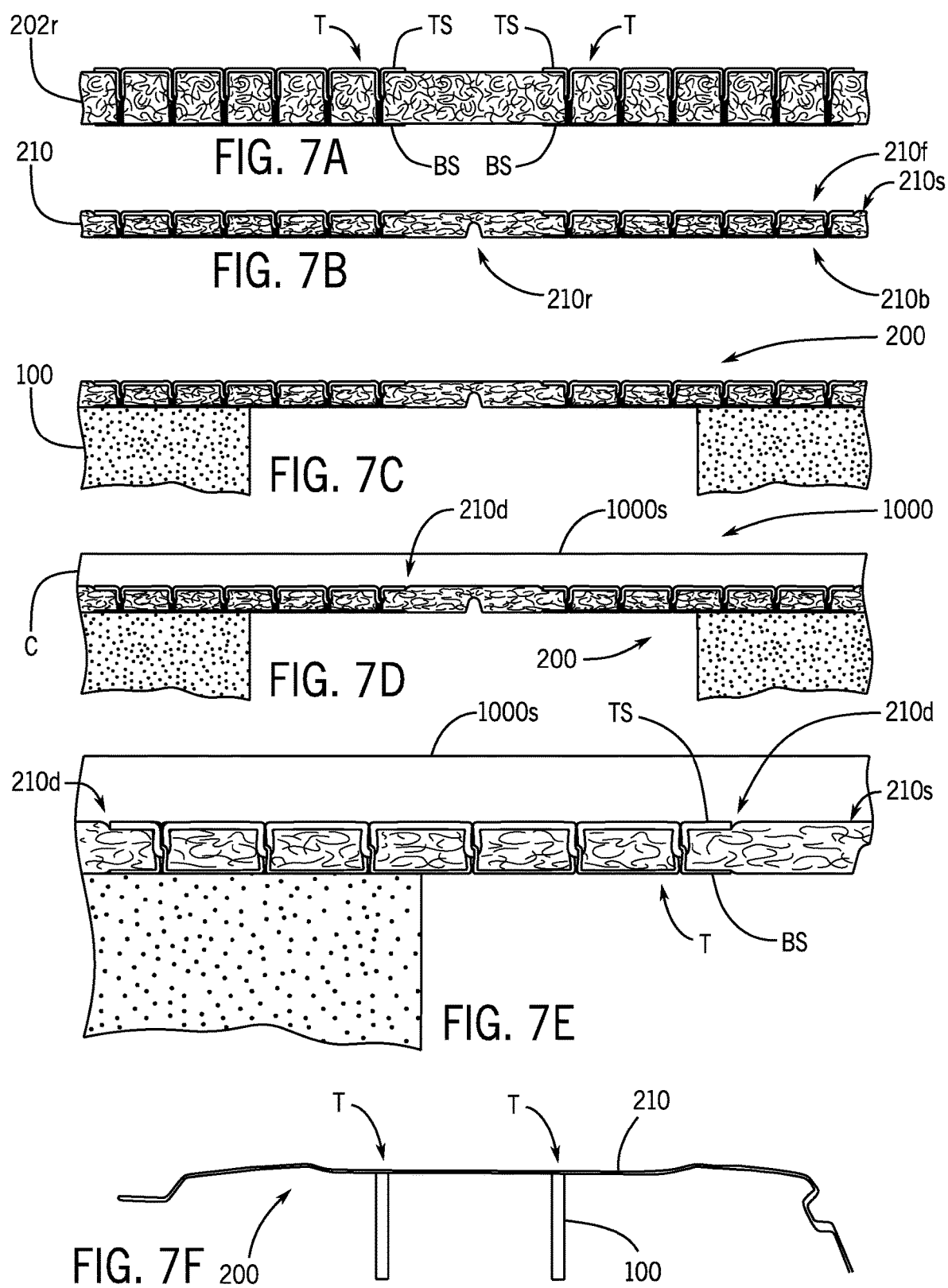

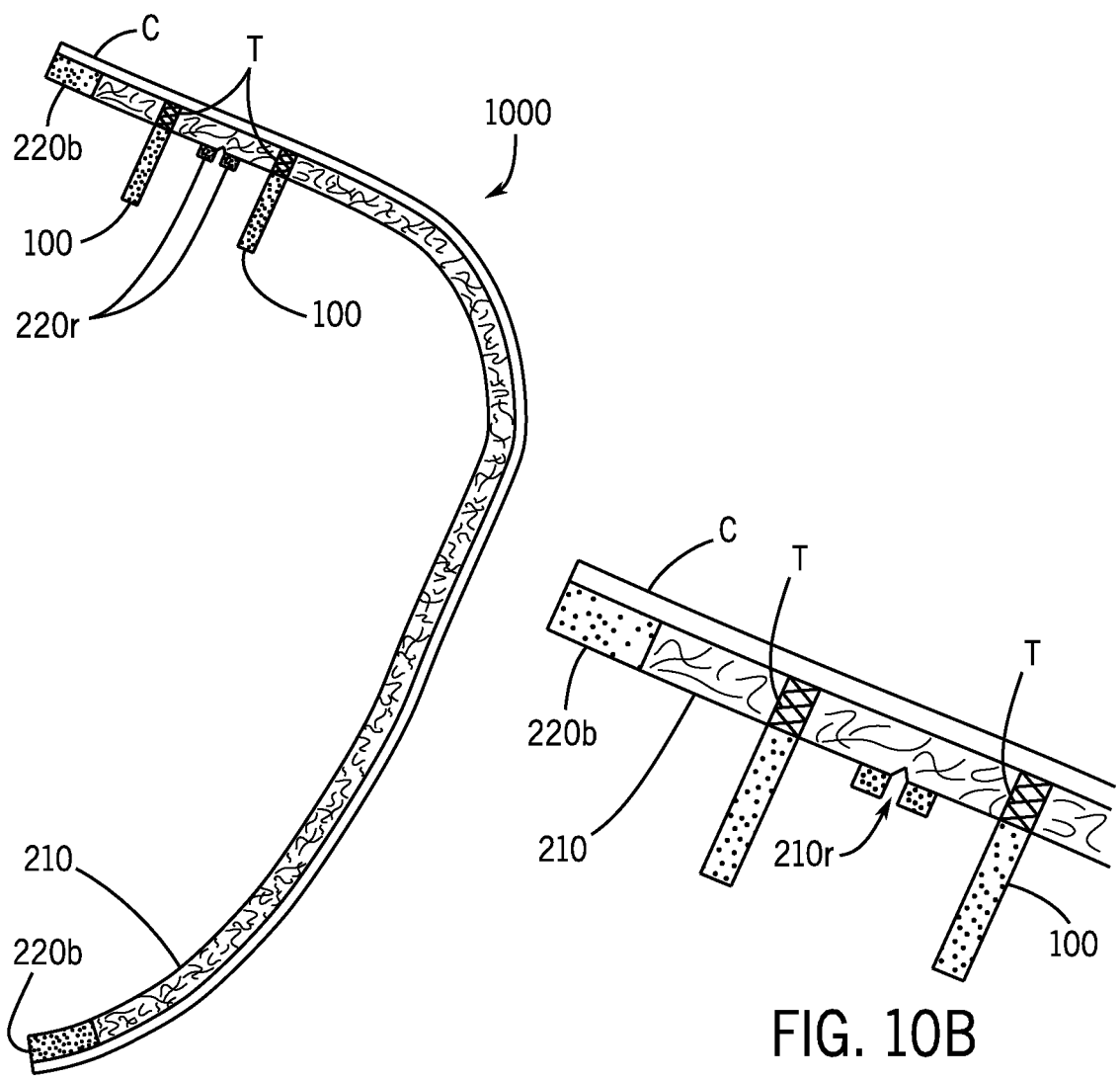
FIG. 10A
FIG. 10B
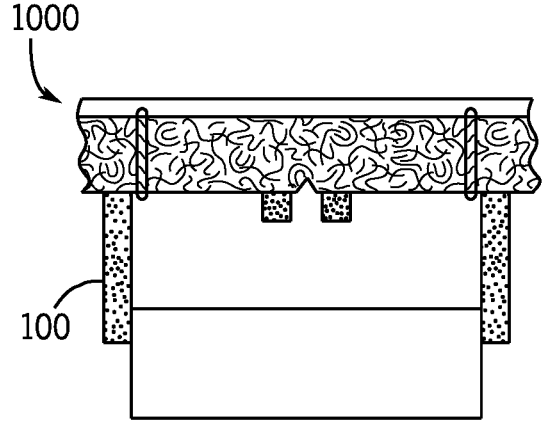
FIG. 10C
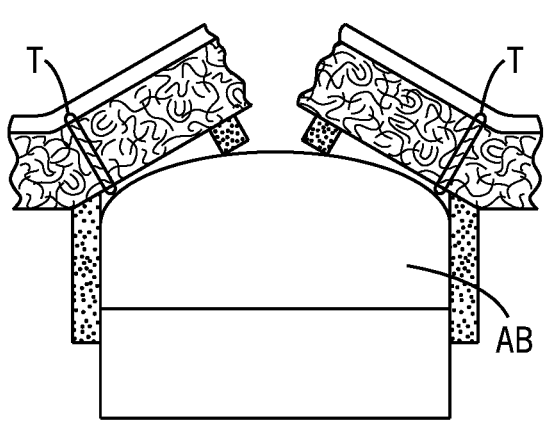
FIG. 10D

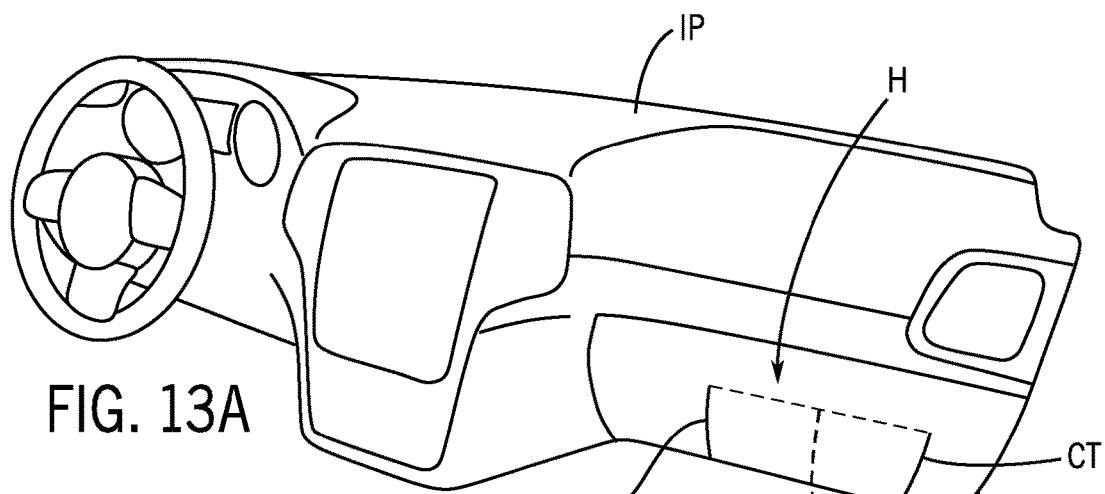
FIG. 13A
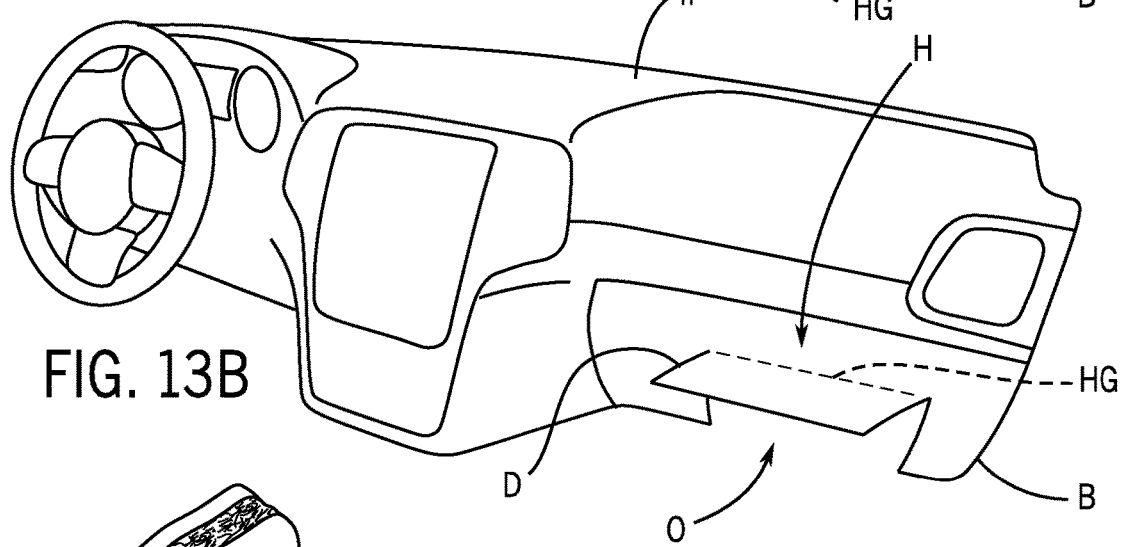
FIG. 13B
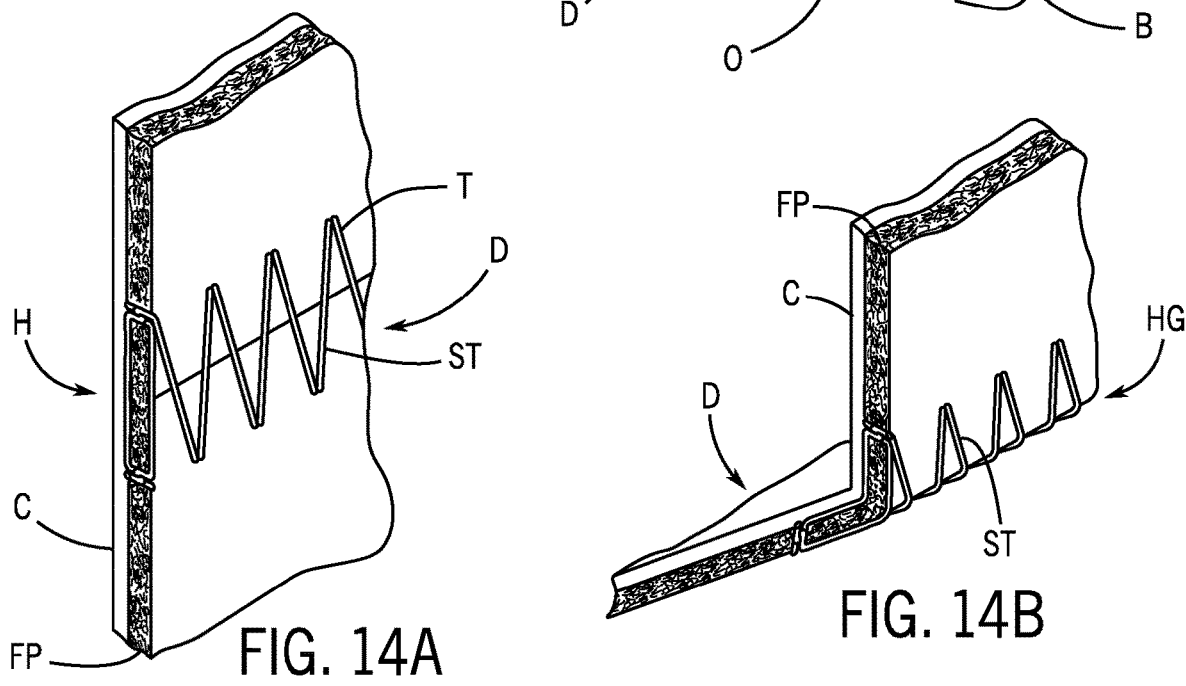
FIG. 14A
FIG. 14B

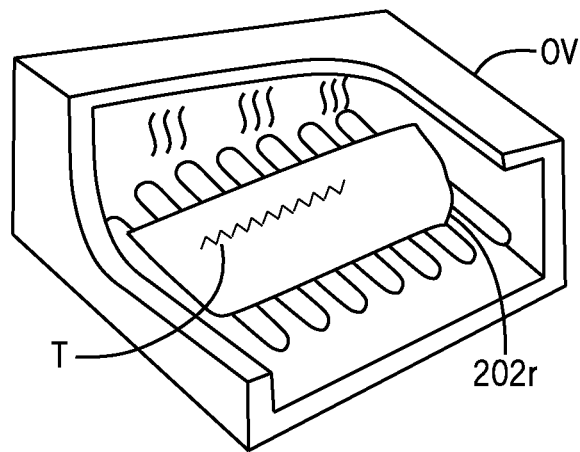
FIG. 16A
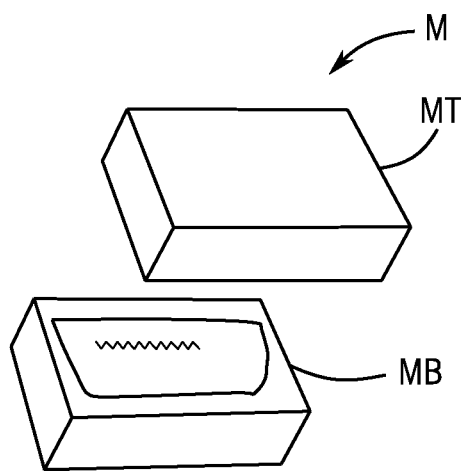
FIG. 16B
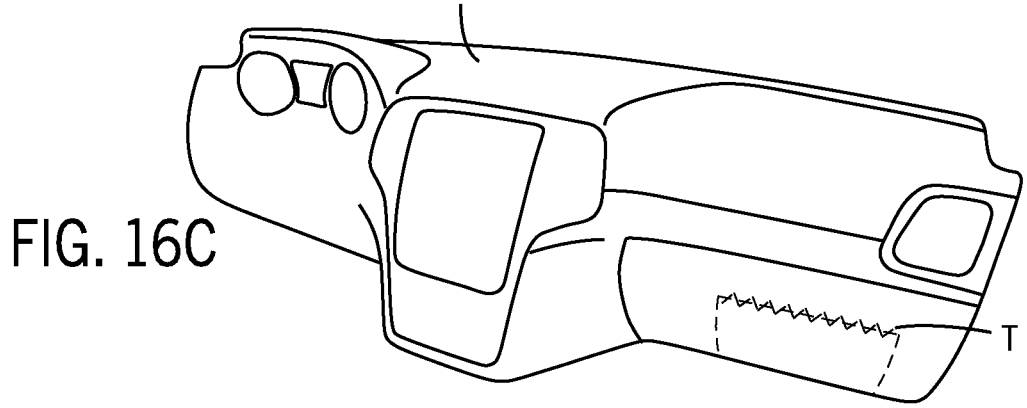
FIG. 16C
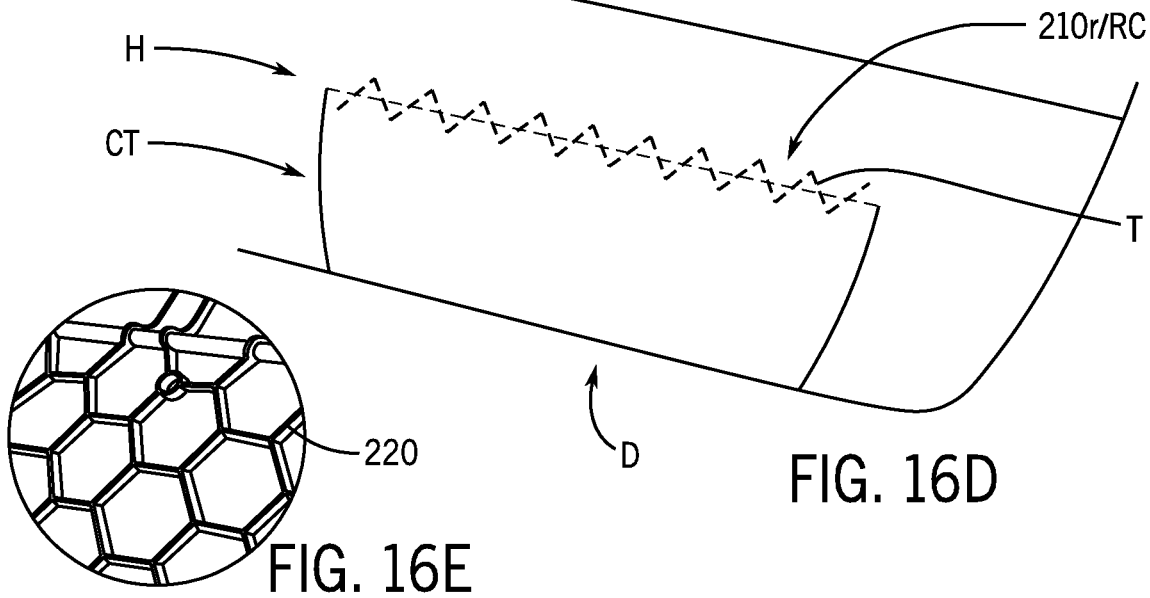
FIG. 16D
FIG. 16E

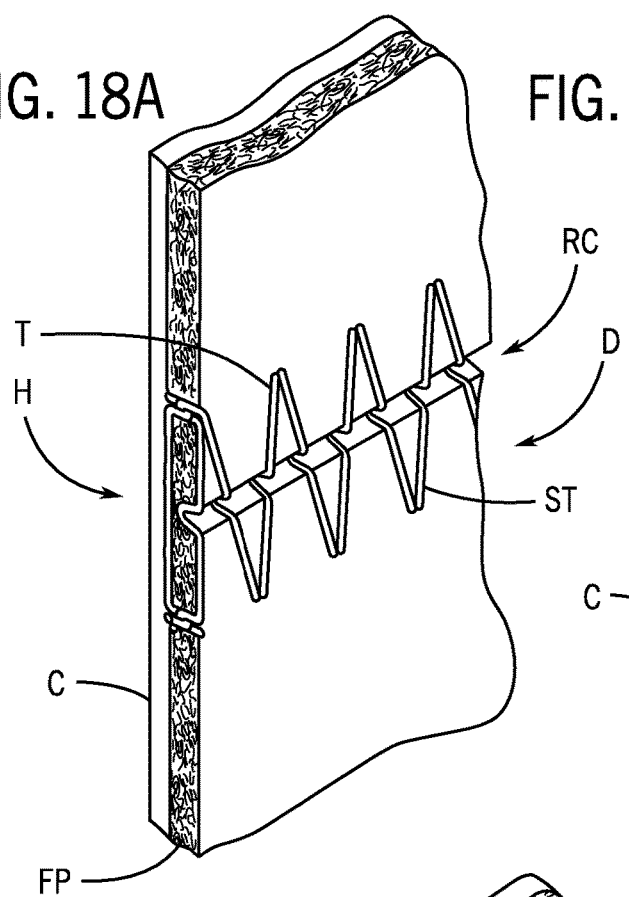
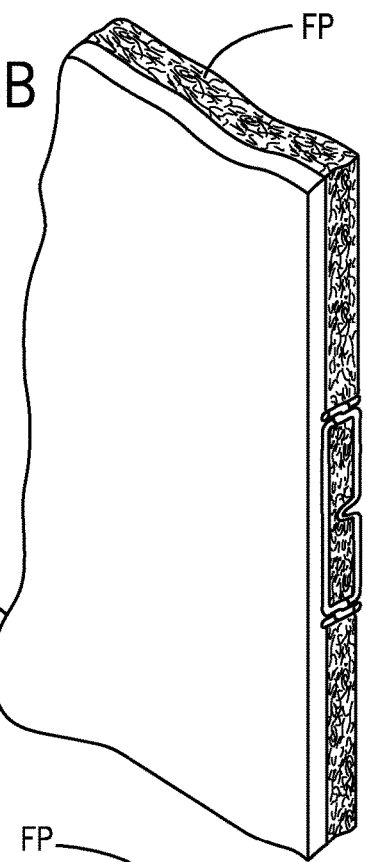
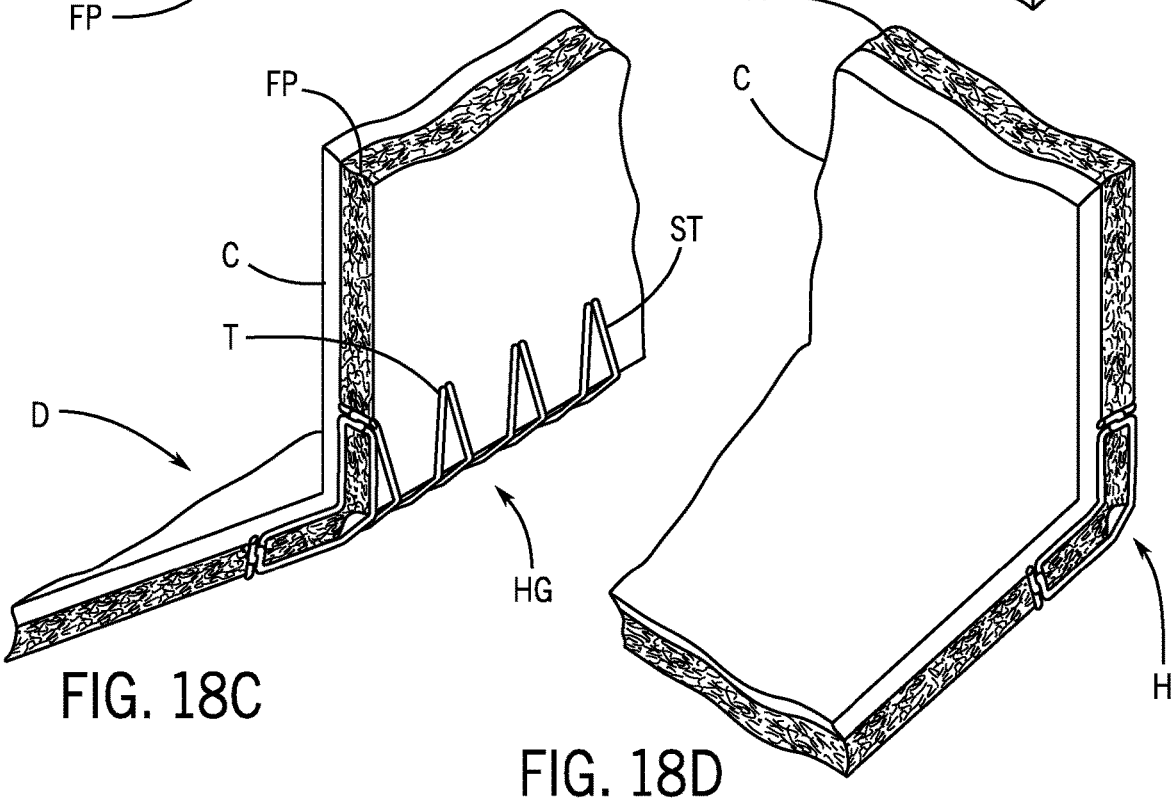
FIG. 18A
FIG. 18B
FIG. 18C
FIG. 18D

VEHICLE INTERIOR COMPONENT

CROSS-REFERENCE TO RELATED APPLICATIONS

The present application is a continuation in part of U.S. patent application Ser. No. 17/006,213 titled "VEHICLE TRIM COMPONENT" filed Aug. 28, 2020, which is a continuation of PCT/International Patent Application No. PCT/US19/39587 titled "VEHICLE TRIM COMPONENT" filed Jun. 27, 2019, which claims the benefit of U.S. Provisional Patent Application No. 62/691,595 titled "VEHICLE TRIM COMPONENT" filed Jun. 28, 2018.

The present application claims priority to and incorporates by reference in full the following patent applications: (a) U.S. Provisional Patent Application No. 62/691,595 titled "VEHICLE TRIM COMPONENT" filed Jun. 28, 2018; (b) PCT/International Patent Application No. PCT/US19/39587 titled "VEHICLE TRIM COMPONENT" filed Jun. 27, 2019; (c) U.S. patent application Ser. No. 17/006,213 titled "VEHICLE TRIM COMPONENT" filed Aug. 28, 2020.

FIELD

The present invention relates to a vehicle interior component.

The present invention also relates to a vehicle trim component.

The present invention further relates to a vehicle interior component configured to provide a door/panel.

BACKGROUND

It is known to provide an airbag in a vehicle configured to deploy from an airbag module through an airbag chute on a trim component and into a vehicle interior. It is known to form a door for deployment of an airbag through the trim component.

It would be advantageous to provide an improved vehicle interior component configured with a substrate comprising a reinforcement configured to provide a hinge for a door.

It would be advantageous to provide an improved trim component configured to provide a reinforcement such as a thread/thread pattern in the trim component.

SUMMARY

The present invention relates to a component for a vehicle interior configured to provide a panel configured to be moved between a closed position and an open position comprising a structural substrate comprising a base providing the panel and a hinge area for the panel; and a reinforcement for the panel at the hinge area. The reinforcement may comprise a stitch pattern configured to reinforce the hinge area during movement of the panel. The hinge area may comprise a hinge. The hinge may comprise material of the structural substrate and the reinforcement. The stitch pattern of the reinforcement may comprise thread sewn into the structural substrate. The panel may comprise a door. The structural substrate may comprise a surface for the stitch pattern; the stitch pattern may be pressed into the surface of the structural substrate. The structural substrate may comprise at least one of (a) a compression-formed component; (b) a generally rigid fiber mat; (c) a fiber panel. The structural substrate may comprise a base; the panel may be configured to be movable relative to the base; the reinforcement may be configured to reinforce the panel to the base at the hinge. The component may comprise a cover providing an exterior surface; the stitch pattern may be concealed at the exterior surface by the cover. The reinforcement may be comprised of at least one of (a) KEVLAR, (b) aramid, (c) nylon, (d) polyester, (e) thread, (f) ceramic fibers, (g) polymeric fibers, (h) synthetic fibers. The stitch pattern may comprise a sewn thread pattern in the base. The component may comprise at least one of an instrument panel; a door panel; a trim panel; a trim component. The component may be formed by a process comprising the step of injecting resin into a mold after a compression-formed structure comprising the structural substrate is formed to form an ancillary component of a composite structure.

The present invention relates to a component for a vehicle interior configured to provide a panel configured to be moved between a closed position and an open position prepared in a mold providing a first mold surface and a second mold surface by a method comprising the steps of providing a substrate comprising a base, forming the substrate with a hinge area so that the panel may be configured to be movable relative to the base of the substrate at the hinge area, joining a reinforcement in the substrate at the hinge area for the panel and compressing the substrate between the first mold surface and the second mold surface of the mold to form a structural substrate having a shape. The shape of the structural substrate may be formed at least partially by the first mold surface and the second mold surface. The reinforcement at the hinge area for the panel may be configured to secure the panel to the base for movement between the closed position and the open position. The step of joining the reinforcement in the substrate may comprise sewing a stitch pattern in the substrate. The step of forming the substrate may comprise at least partially cutting the panel from the base of the substrate. The hinge area may comprise a hinge and the panel may comprise a door. The hinge may comprise a living hinge formed in the base of the substrate. The hinge may comprise material from the substrate reinforced by the stitch pattern of the reinforcement. The hinge area may comprise a recess in the substrate. The step of forming the substrate may comprise at least partially cutting the panel from the base of the substrate and at least partially retaining material for a hinge for the panel at the hinge area. The substrate may comprise a pre-form substrate. The substrate may comprise a fiber panel. The method may comprise the step of providing a cover layer on the substrate; the stitch pattern of the reinforcement may be at least partially concealed by the cover layer. The step of providing a cover layer on the substrate may comprise molding the cover layer on the substrate. Joining the reinforcement in the substrate may comprise sewing a stitch pattern in a surface of the substrate. The method may comprise the step of providing a molded cover on an outer surface of the substrate configured to conceal the stitch pattern in the inner surface of the substrate.

The present invention relates to a component for a vehicle interior configured to provide a panel configured to be moved between a closed position and an open position comprising a structural substrate formed from a fiber panel and a cover for the structural substrate providing an exterior surface. The structural substrate may comprise a hinge for the panel and a stitch pattern at the hinge. The stitch pattern may comprise a thread. The stitch pattern may be configured to provide a reinforcement at the hinge when the panel is rotated between the closed position and the open position.

The stitch pattern may be formed into the structural substrate so that the stitch pattern is not visible at the exterior surface of the cover.

The present invention relates to a trim component for a vehicle interior comprising a structural substrate providing at least one door. The structural substrate may comprise a reinforcement configured to secure the at least one door to the structural substrate. The reinforcement may comprise a top stitch and a bottom stitch. The reinforcement may be comprised of bonded nylon thread. The reinforcement may be comprised of at least one of (a) KEVLAR, (b) aramid, (c) nylon, (d) polyester, (e) thread, (f) ceramic fibers, (h) polymeric fibers, (i) synthetic fibers. The structural substrate may comprise a panel comprised at least partially of fibers; the reinforcement may be comprised of thread sewn to the panel. Thread may be pressed into a surface of the panel during a compression forming process. The structural substrate may comprise at least one of (a) a compression-formed component; (b) a generally rigid fiber mat. The structural substrate may comprise a living hinge for the at least one door; the reinforcement may be positioned at the living hinge.

The present invention relates to a vehicle interior component produced in a mold comprising a first surface and a second surface by a process comprising placing a pre-form substrate onto the first surface of the mold, forming a compression-formed structure from the pre-form substrate by compressing the pre-form substrate between the first surface of the mold and the second surface of the mold and applying a cover to the compression-formed structure to form a panel assembly providing a surface effect. The compression-formed substrate may comprise a door and a living hinge for the door. The pre-form substrate may comprise a reinforcement for the living hinge. The pre-form substrate may comprise a fiber panel; the reinforcement may be comprised of thread sewn to the fiber panel. The compression-formed structure may comprise a substrate layer and the reinforcement. The step of forming the compression-formed structure may comprise forming the substrate layer into a generally rigid form. The step of forming the compression-formed structure may comprise forming the reinforcement and the pre-form substrate with a generally continuous surface. A generally smooth texture of the panel assembly may be provided by (a) a surface effect of the cover and (b) a surface effect of the pre-form substrate. The panel assembly may comprise a composite structure with at least partially a shape of the compression-formed structure; the shape may comprise a first contour provided by the first surface of the mold and a second contour provided by the second surface of the mold. The pre-form substrate may comprise a resin; the process may comprise the step of heating the pre-formed substrate and the pre-formed substrate may be compressed as the pre-formed substrate cools. The process may comprise the step of injecting resin into the mold after the compression-formed structure is formed to form an ancillary component of the panel assembly.

The present invention relates to a component for a vehicle interior providing a hinged panel comprising a composite structure comprising a structural substrate formed from a fiber panel and a cover for the structural substrate providing an exterior surface. The structural substrate may comprise a stitch pattern. The stitch pattern may comprise a thread. The composite structure may be configured so that the stitch pattern provides a reinforcement for the hinged panel so that the hinged panel remains at least partially attached to the composite structure when the hinged panel is rotated at a hinge. The stitch pattern may be provided on the fiber panel. The stitch pattern may be formed into the structural substrate so that the stitch pattern is not visible at the exterior surface of the cover. The set of threads of the stitch pattern may be pressed into a surface of the fiber panel so that the structural substrate comprises a generally flat surface for the cover. The thread may be pressed into a surface of the fiber panel so that the thread is not visible at the exterior surface of the cover of the composite surface. The thread may comprise a network of threads in the fiber panel formed into the structural substrate. The reinforcement may comprise threads for the stitch pattern comprising at least one of (a) KEVLAR, (b) aramid, (c) nylon, (d) polyester, (e) thread, (f) ceramic fibers, (g) polymeric fibers, (h) synthetic fibers; (i) bonded nylon. The hinged panel may be configured to remain at least partially attached to the composite structure by the thread. The stitch pattern may provide the reinforcement at a living hinge for the hinged panel. The thread may comprise a set of threads at least partially sewn into the fiber panel of the structural substrate. The component may comprise a feature on the structural substrate. The feature may comprise at least one of (a) a rib; (b) a set of ribs; (c) a feature adjacent to the reinforcement; (d) a feature at the reinforcement; (e) a feature at the hinged panel; (f) a structure for the hinged panel; (g) a resin-formed feature; (h) a resin-formed feature molded on the structural substrate. The composite structure further may comprise a foam layer beneath the cover. The structural substrate may comprise a compression-formed component from the fiber panel. The cover may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil; (l) coating on the structural substrate; (m) paint on the structural substrate; (n) the exterior surface of the structural substrate. The component may comprise at least one of an instrument panel; a door panel; a trim panel; a trim component.

The present invention relates to a component for a vehicle interior providing a hinged panel comprising a composite structure comprising a structural substrate formed from a fiber panel providing the hinged panel and a cover for the structural substrate providing an exterior surface. The structural substrate may comprise a reinforcement. The reinforcement may be configured so that the hinged panel remains at least partially attached to the composite structure when the hinged panel is rotated at a living hinge.

The present invention relates to a trim component for a vehicle interior prepared using a mold by a process comprising the steps of providing a pre-form substrate, joining a reinforcement to the pre-form substrate to form a reinforced pre-form substrate, disposing the reinforced pre-form substrate onto a first surface of the mold and compressing the reinforced pre-form substrate between the first surface and a second surface of the mold to form the reinforced pre-form substrate into a structural substrate having a shape and comprising a living hinge. The shape may correspond to a first contour of the first surface and a second contour of the second surface. The structural substrate may be configured to provide at least one hinged panel. The reinforcement may be configured to secure the at least one hinged panel to the structural substrate at the living hinge. The step of joining a reinforcement to the pre-form substrate may comprise sewing at least one of a thread or a stitch to the pre-form substrate. The step of joining a reinforcement to the pre-form substrate may comprise piercing an opening in the pre-form substrate and joining a stitch to the pre-form substrate at the opening.

The present invention relates to a method of manufacturing a vehicle trim component comprising the steps of providing a pre-form substrate, joining a reinforcement to the preform substrate to form a reinforced pre-form substrate, disposing the reinforced pre-form substrate onto a first surface of the mold; and compressing the reinforced pre-form substrate between the first surface and a second surface of the mold to form the reinforced pre-form substrate into a structural substrate having a shape and a living hinge. The shape may correspond to a first contour of the first surface and a second contour of the second surface. The structural substrate may be configured to provide at least one hinged panel. The reinforcement may be configured to secure the hinged panel to the structural substrate when the hinged panel is rotated at the living hinge.

The present invention relates to a component for a vehicle interior configured for an airbag chute and an airbag module providing an airbag configured to be deployed through an opening into the vehicle interior comprising a structural substrate configured to provide at least one door upon deployment of the airbag to facilitate deployment of the airbag from the airbag module through the opening. The structural substrate may comprise a reinforcement configured to secure the at least one door to the structural substrate during deployment of the airbag. The reinforcement may comprise a top stitch and a bottom stitch. The top stitch may be configured to secure the door to the structural substrate upon deployment of the airbag. The structural substrate may comprise a panel comprised at least partially of fibers; the reinforcement may be comprised of thread sewn to the panel; thread may be pressed into a surface of the panel during a compression forming process. The structural substrate may comprise at least one of (a) a compression-formed component; (b) a generally rigid fiber mat. The top stitch may comprise a thread weight and the bottom stitch may comprise a thread weight; the thread weight of the top stitch may be generally greater than the thread weight of the bottom stitch. The bottom stitch may be configured to separate upon deployment of the airbag to facilitate deployment of the airbag from the airbag module through the opening. The reinforcement may be comprised of at least one of (a) KEVLAR, (b) aramid, (c) nylon, (d) polyester, (e) thread, (f) ceramic fibers, (h) polymeric fibers, (i) synthetic fibers. The component may be formed by a process comprising the step of injecting resin into a mold after a compression-formed structure comprising the structural substrate is formed to form an ancillary component of a composite structure.

The present invention relates to a component for a vehicle interior configured for an airbag chute and an airbag module providing an airbag configured to be deployed through an opening into the vehicle interior comprising a structural substrate configured to provide at least one door upon deployment of the airbag to facilitate deployment of the airbag from the airbag module through the opening. The structural substrate may comprise a reinforcement configured to secure the at least one door to the structural substrate during deployment of the airbag. The reinforcement may comprise a stitch pattern. The stitch pattern may comprise a pattern of threads. The pattern of threads may comprise a first set of threads and a second set of threads. The stitch pattern may comprise a network of threads formed into the structural substrate. The stitch pattern may comprise a first set of threads comprising a first thread weight and second set of threads comprising a second thread weight; the first thread weight may be greater than the second thread weight. The stitch pattern may comprise a set of threads at least partially sewn into the structural substrate. The structural substrate may comprise a fiber panel; the pattern of threads may be pressed into a surface of the fiber panel so that the structural substrate may comprise a generally flat surface for the cover. The structural substrate may comprise a compression-formed component from the fiber panel. The stitch pattern may comprise an upper set of threads and a lower set of threads; the upper set of threads may comprise a set of retaining threads. The lower set of threads may comprise a set of sacrificial threads; the door may be configured to remain at least partially attached at a hinge provided by the set of retaining threads. The component may further comprise a cover providing an exterior surface; the stitch pattern may be formed into the structural substrate so that the stitch pattern is not visible at the exterior surface of the cover. The component may comprise at least one of an instrument panel; a door panel; a trim panel.

The present invention relates to a component for a vehicle interior configured to support an airbag module providing an airbag for deployment through an opening into the vehicle interior prepared using a mold by a process comprising the steps of providing a preform substrate; joining a reinforcement to the pre-form substrate in at least one hinge area to form a reinforced pre-form substrate; disposing the reinforced pre-form substrate onto a first surface of the mold; and compressing the reinforced pre-form substrate between the first surface and a second surface of the mold to form the reinforced pre-form substrate into a structural substrate having a shape. The shape may correspond to a first contour of the first surface and a second contour of the second surface; the structural substrate may be configured to provide at least one door established upon deployment of the airbag to facilitate deployment of the airbag from the airbag module through the opening; the reinforcement may be configured to secure the at least one door to the structural substrate during deployment of the airbag. The step of joining the reinforcement to the pre-form substrate may comprise sewing at least one of a thread or a stitch to the pre-form substrate. The step of joining the reinforcement to the pre-form substrate may comprise piercing an opening in the pre-form substrate and joining a top stitch to a bottom stitch at the opening.

The present invention relates to a component for a vehicle interior configured to support an airbag chute and an airbag module providing an airbag configured to be deployed through an opening into the vehicle interior comprising: a structural substrate providing at least one door established upon deployment of the airbag to facilitate deployment of the airbag from the airbag module through the opening. The structural substrate may comprise a reinforcement configured to secure the at least one door to the structural substrate during deployment of the airbag. The reinforcement may comprise at least one stitch. The reinforcement may comprise a top stitch and a bottom stitch. The top stitch may comprise a thread weight and the bottom stitch may comprise a thread weight; the thread weight of the top stitch may be generally greater than the thread weight of the bottom stitch. The top stitch may comprise 210 Tex thread; the bottom stitch may comprise 70 Tex thread. The bottom stitch may be configured to separate upon deployment of the airbag to facilitate deployment of the airbag from the airbag module through the opening. The top stitch may be configured to secure the door to the structural substrate upon deployment of the airbag. The top stitch may be configured to stretch upon deployment of the airbag to secure the door to the structural substrate. The reinforcement may be comprised of bonded nylon thread. The reinforcement may be comprised of at least one of (a) KEVLAR, (b) aramid, (c) nylon, (d) polyester, (e) thread, (f) ceramic fibers, (h) polymeric fibers, (i) synthetic fibers. The structural substrate may comprise a panel comprised at least partially of fibers; the reinforcement may be comprised of thread sewn to the panel. The thread may be pressed into a surface of the panel during a compression forming process. The panel may comprise a depression; the thread may be joined to the panel at the depression. The thread and the panel may form a generally continuous surface for the component. The structural substrate may comprise a compression-formed component. The compression-formed component may comprise a recess in a back side of the structural substrate configured to establish the opening so that the airbag will deploy through the compression-formed component at the opening. The structural substrate may be formed at least partially from fibers. The component may further comprise a cover to provide a surface on a front side of the structural substrate. Contact between the airbag and the at least one door may induce tearing of the cover to establish the opening for the airbag and to facilitate deployment of the airbag through the opening. The airbag chute may define at least one hinge area for the at least one door; the reinforcement may be positioned adjacent the hinge area. The structural substrate may comprise a generally rigid fiber mat. The component may further comprise a cover; the cover may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil.

The present invention relates to a vehicle interior component produced in a mold comprising a first surface and a second surface by a process comprising: placing a pre-form substrate onto the first surface of the mold, forming a compression-formed structure from the pre-form substrate by compressing the pre-form substrate between the first surface of the mold and the second surface of the mold, and applying a cover to the compression-formed structure to form a panel assembly providing a surface effect. The pre-form substrate may comprise a reinforced pre-form substrate. The reinforcement may comprise at least one of (a) KEVLAR, (b) aramid, (c) nylon, (d) polyester, (e) thread, (f) ceramic fibers, (h) polymeric fibers, (i) synthetic fibers. The substrate layer may comprise a panel comprised at least partially of fibers; the reinforcement may be comprised of thread sewn to the panel. The compression-formed structure may comprise the substrate layer and the reinforcement. The reinforced pre-form substrate may comprise a surface effect comprising a generally smooth texture. The surface effect of the panel assembly may generally comprise the surface effect of the reinforced pre-from substrate. The step of forming the compression-formed structure may comprise forming the reinforcement and the pre-form substrate into a generally continuous surface. The substrate layer for the pre-form substrate may comprise a fiber mat. The substrate layer may comprise a generally rigid fiber mat. The step of forming the compression-formed structure may comprise forming the substrate layer into a generally rigid form. The surface effect of the panel assembly may comprise the generally rigid form of the substrate layer of the compression-formed structure. The surface effect of the panel assembly may comprise a generally smooth texture and a generally rigid form. The generally smooth texture of the panel assembly may be provided by (a) a surface effect of the cover and (b) a surface effect of the pre-form substrate. The cover of the panel assembly may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil. The compression-formed structure may comprise a shape. The panel assembly may comprise at least partially the shape of the compression-formed structure. The shape may comprise a first contour provided by the first surface of the mold and a second contour provided by the second surface of the mold. The substrate layer for the pre-form substrate may comprise a fiber mat. The process may comprise the step of forming the pre-form substrate from a generally compressible fiber mat. The pre-form substrate may comprise natural fibers and a resin. The resin may comprise polypropylene and the natural fibers comprise at least one of (a) flax; (b) kenaf. The pre-form substrate may comprise an area weight of between 1000 grams per square meter and 1800 grams per square meter. The pre-form substrate may comprise a thickness of between 1.5 mm and 4 mm; the compression-formed structure may comprise a thickness of between 0.8 mm and 3 mm. The process may comprise the step of heating the pre-formed substrate; the pre-formed substrate may be compressed as the pre-formed substrate cools. The process may comprise the step of injecting resin into the mold after the compression-formed structure is formed to form an ancillary component of the panel assembly.

The present invention relates to a component for a vehicle interior configured to support an airbag module configured to deploy an airbag through an airbag chute by establishing a door providing an opening into the vehicle interior for the airbag comprising a composite structure comprising a structural substrate formed from a fiber panel and a cover for the structural substrate providing an exterior surface. The structural substrate may comprise a stitch pattern. The composite structure may be configured so that when the airbag is deployed from the airbag module the stitch pattern provides a reinforcement for the door providing the opening so that the airbag can be deployed through the opening while the door remains at least partially attached to the composite structure. The reinforcement may comprise a set of threads. The stitch pattern may provide the reinforcement at a hinge area for the door. The stitch pattern may comprise a set of threads. The set of threads for the stitch pattern may comprise a first set of threads and a second set of threads. The set of threads for the stitch pattern may comprise an upper set of threads and a lower set of threads. The upper set of threads may comprise a set of retaining threads and the lower set of threads may comprise a set of sacrificial threads. The set of threads for the stitch pattern may comprise a set of retaining threads configured to stretch and a set of sacrificial threads configured to break. The door may remain at least partially attached to the composite structure by the set of retaining threads. The retaining threads may provide the reinforcement for the door. The sacrificial threads may be configured to rupture when the airbag establishes the door and the opening in the composite structure. The set of threads for the stitch pattern may comprise a set of upper threads and a set of lower threads; the upper threads may provide a hinge for the door; the lower threads may comprise sacrificial threads configured to rupture when the airbag establishes the opening in the composite structure. The stitch pattern may be provided on the fiber panel. The stitch pattern may be formed into the structural substrate. The stitch pattern may be formed into the structural substrate so that the stitch pattern may not be visible at the exterior surface of the cover. The stitch pattern may comprise a network of threads in the fiber panel formed into the structural substrate. The reinforcement provided by the stitch pattern may comprise reinforcement for the composite structure. The stitch pattern may comprise a first set of threads comprising a first thread weight and second set of threads comprising a second thread weight; the first thread weight may be larger than the second thread weight. The stitch pattern may comprise a set of retaining threads comprising 210 Tex thread and a set of sacrificial threads comprising 70 Tex thread. The set of retaining threads may be configured to stretch upon deployment of the airbag through the door for the composite structure. The stitch pattern may comprise a set of threads at least partially sewn into the fiber panel of the structural substrate. The set of threads of the stitch pattern may be pressed into a surface of the fiber panel. The set of threads of the stitch pattern may be pressed into a surface of the fiber panel so that the structural substrate may comprise a generally flat surface for the cover. The set of threads of the stitch pattern may be pressed into a surface of the fiber panel so that the set of threads may not be visible at the exterior surface of the cover of the composite surface. The reinforcement may comprise bonded nylon thread. The reinforcement may comprise a set of threads for the stitch pattern comprising at least one of (a) KEVLAR, (b) aramid, (c) nylon, (d) polyester, (e) thread, (f) ceramic fibers, (h) polymeric fibers, (i) synthetic fibers. The component may further comprise a notch in the structural substrate configured to facilitate establishment of the opening for the airbag through the composite structure. The structural substrate may be formed into a shape. The component may further comprise a feature on the structural substrate. The feature may comprise the airbag chute. The feature may comprise a resin-formed feature molded on the structural substrate. The feature may comprise at least one of (a) the airbag chute; (b) a passage for the airbag; (c) a rib; (d) a set of ribs; (e) a feature adjacent to the reinforcement; (f) a feature at the reinforcement; (g) a feature at a hinge area; (h) a feature at the opening; (i) a feature configured to facilitate the opening; (j) a structure for the door; (k) a set of ribs configured to establish a seam for the door; (l) structure for a double door comprising the door; (m) the airbag chute at the hinge area; (n) a resin-formed feature. The door may comprise a double door; the feature may comprise a seam to facilitate formation of the double door. The door may comprise a double door providing the opening for the airbag; the reinforcement may comprise a hinge area for each door of the double door. The composite structure further may comprise a foam layer beneath the cover. The reinforcement may comprise a hinge area configured for the door established by deployment of the airbag through the airbag chute. The structural substrate may comprise a compression-formed component from the fiber panel. The structural substrate may comprise a generally rigid fiber mat. The cover may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil; (l) coating on the structural substrate; (m) paint on the structural substrate; (n) the exterior surface of the structural substrate. The component may comprise at least one of an instrument panel; a door panel; a trim panel; a trim component.

The present invention relates to a component for a vehicle interior configured to support an airbag module configured to deploy an airbag through an airbag chute by establishing a door providing an opening into the vehicle interior for the airbag comprising a composite structure comprising a structural substrate formed from a fiber panel, a cover for the structural substrate providing an exterior surface and a feature formed from resin on the structural substrate. The structural substrate may comprise a reinforcement; the reinforcement may be configured so that the door established by deployment of the airbag remains at least partially attached to the composite structure. The reinforcement may comprise a pattern of threads; the pattern of threads may be configured so that when the airbag is deployed from the airbag module the door remains at least partially attached to the composite structure by at least a portion of the pattern of threads. The pattern of threads may comprise a first stitch pattern and a second stitch pattern. The pattern of threads may comprise a set of stitches. The pattern of threads may comprise a stitch network. The stitch network may comprise a hinge for the door; the stitch network for the reinforcement may comprise a set of retaining threads and a set of sacrificial threads. The pattern of threads for the reinforcement may comprise a first set of threads and a second set of threads. The pattern of threads for the reinforcement may comprise a set of retaining threads and a set of sacrificial threads. The pattern of threads for the reinforcement may comprise a set of strong threads and a set of weak threads. The set of threads for the reinforcement may comprise a set of retaining threads and a set of sacrificial threads; the set of retaining threads may be configured to comprise the reinforcement after deployment of the airbag. The reinforcement may comprise a hinge area for the door. The reinforcement may comprise a hinge for the door. The feature may comprise a resin-formed feature molded on the structural substrate. The feature may comprise the airbag chute. The resin-formed feature may comprise at least one of (a) the airbag chute; (b) a passage for the airbag; (c) a rib; (d) a set of ribs; (e) a feature adjacent to the reinforcement; (f) a feature at the reinforcement; (g) a feature at a hinge area; (h) a feature at the opening; (i) a feature configured to facilitate the opening; (j) structure for the door; (k) a set of ribs configured to establish a seam for the door; (l) structure for a double door comprising the door.

The present invention relates to a trim component for a vehicle interior configured to support an airbag module providing an airbag for deployment through an opening into the vehicle interior prepared using a mold by a process comprising the steps of: providing a pre-form substrate, joining a reinforcement to the pre-form substrate in at least one hinge area to form a reinforced pre-form substrate, disposing the reinforced pre-form substrate onto a first surface of the mold, and compressing the reinforced pre-form substrate between the first surface and a second surface of the mold to form the reinforced pre-form substrate into a structural substrate having a shape. The shape may correspond to a first contour of the first surface and a second contour of the second surface. The structural substrate may be configured to provide at least one door established upon deployment of the airbag to facilitate deployment of the airbag from the airbag module through the opening. The reinforcement may be configured to secure the at least one door to the structural substrate during deployment of the airbag. The step of joining a reinforcement to the pre-form substrate may comprise sewing at least one of a thread; a stitch to the pre-form substrate. The at least one of the thread or the stitch may be comprised of at least one of (a) KEVLAR, (b) aramid, (c) nylon, (d) polyester, (e) ceramic fibers, (f) polymeric fibers, (g) synthetic fibers. The step of joining a reinforcement to the pre-form substrate may comprise piercing an opening in the pre-form substrate and joining a top stitch to a bottom stitch at the opening. The top stitch may comprise a thread weight and the bottom stitch may comprise a thread weight; the thread weight of the top stitch may be generally greater than the thread weight of the bottom stitch. The process may comprise the step of forming a recess in a surface of at least one of the pre-form substrate; the structural substrate; the recess may be configured to facilitate deployment of the airbag.

The present invention relates to a method of manufacturing a vehicle trim component configured to support an airbag module providing an airbag for deployment from the airbag module through an opening into the vehicle interior comprising the steps of: providing a pre-form substrate, joining a reinforcement to the pre-form substrate in at least one hinge area to form a reinforced pre-form substrate, disposing the reinforced pre-form substrate onto a first surface of the mold, and compressing the reinforced pre-form substrate between the first surface and a second surface of the mold to form the reinforced pre-form substrate into a structural substrate having a shape. The shape may correspond to a first contour of the first surface and a second contour of the second surface. The structural substrate may be configured to provide at least one door established upon deployment of the airbag to facilitate deployment of the airbag from the airbag module through the opening. The reinforcement may be configured to secure the door to the structural substrate during deployment of the airbag.

The present invention relates to a trim component for a vehicle interior configured to support an airbag chute and an airbag module providing an airbag configured to be deployed through an opening into the vehicle interior. The component may comprise a structural substrate providing a front side, a back side and at least one door established upon deployment of the airbag to facilitate deployment of the airbag from the airbag module through the opening. The structural substrate may comprise a reinforcement configured to secure the door to the structural substrate during deployment of the airbag. The reinforcement may comprise at least one stitch. The reinforcement may be comprised of at least one of (a) KEVLAR, (b) aramid, (c) nylon, (d) polyester, (e) thread, (f) ceramic fibers, (g) polymeric fibers, (h) synthetic fibers. The structural substrate may comprise a panel comprised at least partially of fibers. The reinforcement may be comprised of thread sewn to the panel. The structural substrate may comprise a compression-formed component. The compression-formed component may comprise a recess in the back side of the structural substrate configured to establish the opening so that the airbag will deploy through the compression-formed component at the opening. The structural substrate may be formed at least partially from fibers. The trim component may comprise a cover to provide a surface on the front side of the structural substrate. Contact between the airbag and the door may induce tearing of the cover to establish the opening for the airbag and may facilitate deployment of the airbag through the opening.

The present invention relates to a trim component for a vehicle interior configured to support an airbag module providing an airbag for deployment through an opening into the vehicle interior prepared using a mold by a process. The process may comprise the steps of providing a fiber panel, joining a reinforcement to the fiber panel in at least one hinge area to form a reinforced fiber panel, disposing the reinforced fiber panel onto a first surface of the mold, compressing the reinforced fiber panel between the first surface and a second surface of the mold to form the reinforced fiber panel into a structural substrate having a shape and attaching a structure on a side of the structural substrate. The shape may correspond to a first contour of the first surface and a second contour of the second surface. The structural substrate may be configured to provide at least one door established upon deployment of the airbag to facilitate deployment of the airbag from the airbag module through the opening. The structure may be configured to support the airbag module and to direct the airbag toward the structural substrate to establish the opening and the door during deployment of the airbag. The reinforcement may be configured to secure the door to the structural substrate during deployment of the airbag. Joining a reinforcement to the fiber panel may comprise sewing at least one of a thread; a stitch to the fiber panel. The at least one of the thread; the stitch may be comprised of at least one of (a) KEVLAR, (b) aramid, (c) nylon, (d) polyester, (e) ceramic fibers, (f) polymeric fibers, (g) synthetic fibers. Attaching the structure on a side of the structural substrate may comprise injecting resin into the mold. The process may comprise the step of forming a recess in a surface of at least one of the fiber panel; the reinforced fiber panel; the recess may be configured to facilitate deployment of the airbag.

The present invention relates to a method of manufacturing a vehicle trim component configured to support an airbag module providing an airbag for deployment from the airbag module through an opening into the vehicle interior. The method may comprise the steps of providing a fiber panel, joining a reinforcement to the fiber panel in at least one hinge area to form a reinforced fiber panel, disposing the reinforced fiber panel onto a first surface of the mold, compressing the reinforced fiber panel between the first surface and a second surface of the mold to form the reinforced fiber panel into a structural substrate having a shape and attaching a structure on a side of the structural substrate. The shape may correspond to a first contour of the first surface and a second contour of the second surface. The structural substrate may be configured to provide at least one door established upon deployment of the airbag to facilitate deployment of the airbag from the airbag module through the opening. The structure may be configured to support the airbag module and may direct the airbag toward the structural substrate to establish the opening and the door during deployment of the airbag. The reinforcement may be configured to secure the door to the structural substrate during deployment of the airbag.

FIGURES

FIGS. 7A through 7E are schematic partial section views of a process to form a vehicle interior component shown as an instrument panel according to an exemplary embodiment.

FIG. 7F is a schematic partial section view of a vehicle interior component shown as an instrument panel according to an exemplary embodiment.

FIG. 10A is a schematic section view of a component for a vehicle interior according to an exemplary embodiment.

FIG. 10B is a schematic cut-away section view of a component for a vehicle interior according to an exemplary embodiment.

FIGS. 10C through 10D are schematic cut-away section views of a deployment of an airbag through a component for a vehicle interior according to an exemplary embodiment.

FIGS. 13A and 13B are schematic perspective views of a vehicle interior component shown as an instrument panel according to an exemplary embodiment.

FIGS. 14A and 14B are schematic cutaway perspective views of a vehicle interior component according to an exemplary embodiment.

FIGS. 16A through 16C are schematic perspective views of a process to form a structural substrate from a reinforced fiber panel according to an exemplary embodiment.

FIG. 16D is a schematic perspective cut-away view of a structural substrate according to an exemplary embodiment.

FIG. 16E is a schematic perspective cut-away view of a component for a vehicle interior according to an exemplary embodiment.

FIGS. 18A through 18D are schematic cutaway perspective views of a vehicle interior component according to an exemplary embodiment.

DESCRIPTION

Figure 1A:
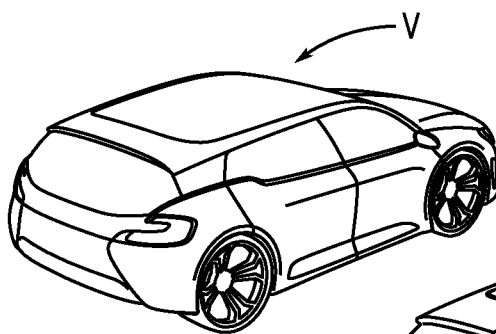
FIG. 1A is a schematic perspective view of a vehicle according to an exemplary embodiment.
Figure 1B:
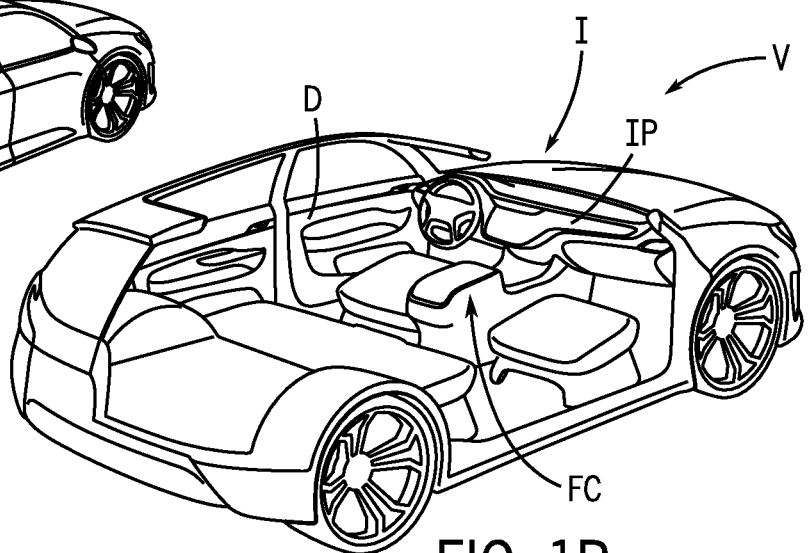
FIG. 1B is a schematic perspective cut-away view of a vehicle showing a vehicle interior according to an exemplary embodiment.
Figure 1C:
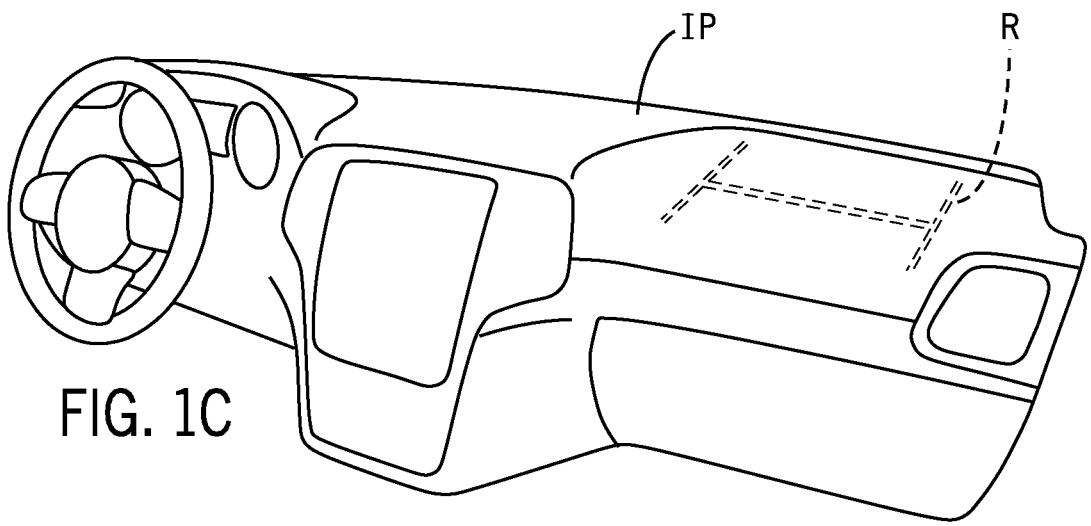
FIG. 1C is a schematic perspective view of a vehicle interior component shown as an instrument panel according to an exemplary embodiment.
Figure 1D:
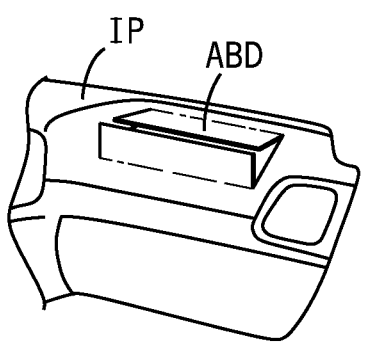
FIGS. 1D through 1F are schematic perspective detail views of an airbag deployment according to an exemplary embodiment.
Figure 1E:
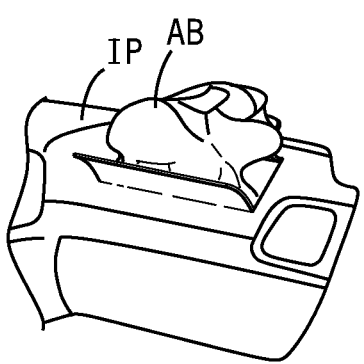
Figure 1F:
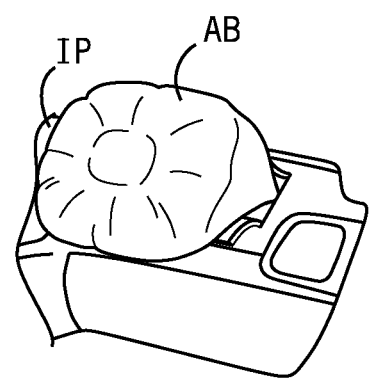
Figure 2A:
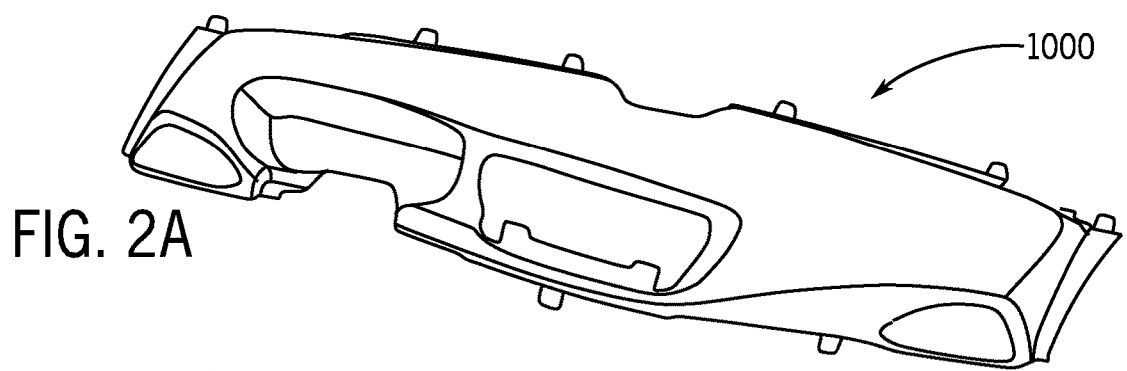
FIG. 2A is a schematic perspective view of a vehicle interior component shown as an instrument panel according to an exemplary embodiment.
Figure 2B:
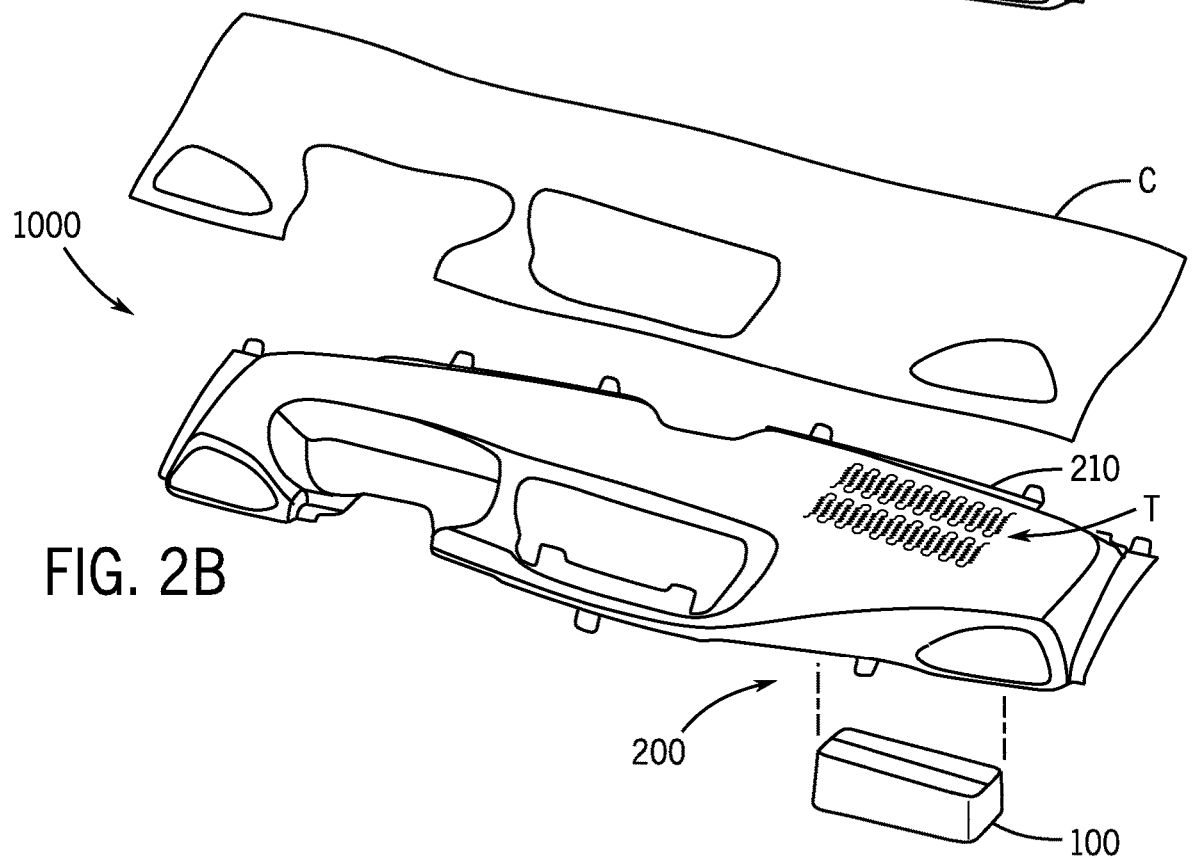
FIG. 2B is a schematic exploded perspective view of a vehicle interior component shown as an instrument panel according to an exemplary embodiment.
Figure 2C:
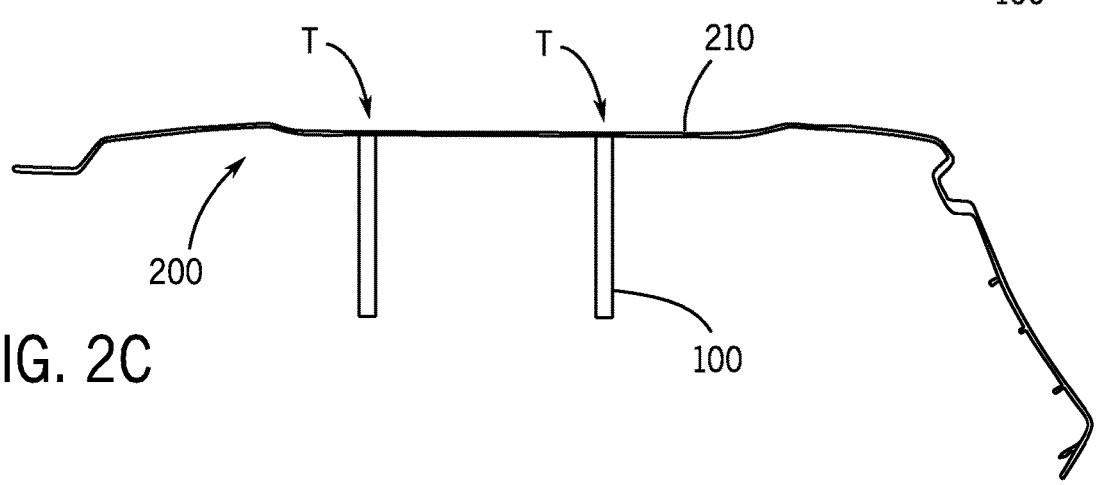
FIG. 2C is a schematic partial section view of a vehicle interior component shown as an instrument panel according to an exemplary embodiment.

Referring to FIGS. 1A and 1B, a vehicle V is shown schematically with an interior I comprising components such as trim components, panels, consoles, etc. As indicated schematically according to an exemplary embodiment in FIGS. 1C-1F and 13A-13B, the vehicle interior may comprise a component such as a trim panel shown as instrument panel IP configured to provide a door such as an airbag door ABD to facilitate deployment of an airbag AB (see FIGS. 1C-1F) or a moveable panel/door D to provide access into an opening O (see FIGS. 13A-13B).

As shown schematically according to an exemplary embodiment in FIGS. 3A-3F, 11A-11B, 12, 15A-15F, 19 and 20, the component may comprise a substrate such as a fiber panel FP/202 formed with a reinforcement T such as a stitch/stitch pattern ST at a hinge area for the door ABD/D. See also FIGS. 6A-6C, 7A-7F, 8A-8E, 14A-14B, 17A-17E and 18A-18D.

Exemplary Embodiments—A

Referring to FIGS. 1A and 1B, a vehicle V is shown including an interior I with vehicle interior components shown as an instrument panel IP, doors D and a floor console FC. According to an exemplary embodiment, components of vehicle V such as instrument panel IP and doors D may include trim components/panels comprised of fiber and plastic. According to an exemplary embodiment, instrument panel IP and doors D may provide visible surfaces in the vehicle interior of vehicle V. According to an exemplary embodiment, vehicle interior/trim components such as instrument panel IP and/or doors D may provide at least one airbag behind the visible surfaces; instrument panel IP and/or doors D may provide a weakened area to aid the airbag in breaking through the trim component/panel during airbag deployment. See FIGS. 1D-1F.

According to an exemplary embodiment as shown schematically in FIGS. 1C-1F, instrument panel IP may provide a weakened shape/zone shown as a recess R (e.g. a line, score line, cut, notch, groove, discontinuity, interruption, etc.) to facilitate an airbag AB deployment through an airbag door ABD. According to an exemplary embodiment, the weakened shape/zone may comprise at least one of a recess or a score line behind the visible surface of instrument panel IP; as shown schematically, the weakened shape/zone may comprise an "H" shape pattern (e.g. corresponding to a door, double-door, etc. for the airbag to comprise the airbag door in the panel). See FIGS. 1C and 1D-1F. According to an exemplary embodiment, the weakened shape/zone may comprise a "U" shape pattern, a "bow tie" shape pattern, or any pattern suitable for airbag deployment.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a trim component 1000 may be provided for a vehicle interior; the component 1000 (e.g. a composite structure) may be configured to support an airbag chute and an airbag module providing an airbag configured to be deployed through an opening into the vehicle interior. The component 1000 (e.g. composite structure/panel, etc.) may comprise a structural substrate 210 providing at least one door established upon deployment of the airbag to facilitate deployment of the airbag from the airbag module through the opening. See FIGS. 1C-1F and 2A-2C. Structural substrate 210 may comprise a reinforcement T (shown as comprising a thread pattern, set/network of threads, etc.) configured to secure the at least one door to structural substrate 210 during deployment of the airbag. See e.g. FIGS. 1C-1F, 2B and 8A-8E. Reinforcement T may comprise a stitch arrangement (e.g. at least one stitch, set of stitches, pattern of stitches, etc.). As shown schematically according to an exemplary embodiment in FIGS. 2B-2C, 3D-3F, 4C, 5A-5C and 7A-7F, the reinforcement T may comprise a top stitch TS and a bottom stitch BS (e.g. to comprise the pattern of stitches, stitch network, etc.). See also FIGS. 8A-8E. According to an exemplary embodiment, top stitch TS may comprise a thread weight and bottom stitch BS may comprise a thread weight; the thread weight of top stitch TS may be generally greater than the thread weight of bottom stitch BS; for example, top stitch TS may comprise 210 Tex thread; bottom stitch BS may comprise 70 Tex thread. As indicated schematically in FIGS. 8A-8E, bottom stitch BS may be configured to separate upon deployment of the airbag to facilitate deployment of the airbag from the airbag module through the opening; top stitch TS may be configured to secure the door to structural substrate 210 upon deployment of the airbag. Top stitch TS may be configured to stretch upon deployment of the airbag to secure the door to structural substrate 210. Reinforcement T may be comprised of bonded nylon thread and/or thread material of at least one of (a) KEVLAR, (b) aramid, (c) nylon, (d) polyester, (e) thread, (f) ceramic fibers, (g) polymeric fibers, (h) synthetic fibers.

Figure 3A:
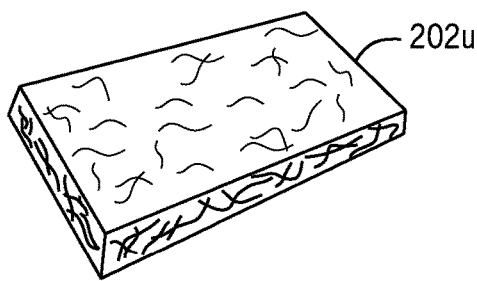
FIGS. 3A through 3F are schematic perspective views of a process to form a reinforced fiber panel according to an exemplary embodiment.
Figure 3B:
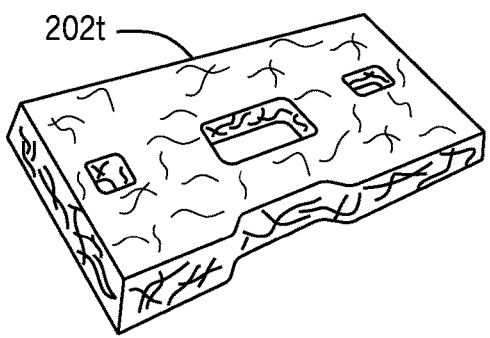
Figure 3C:
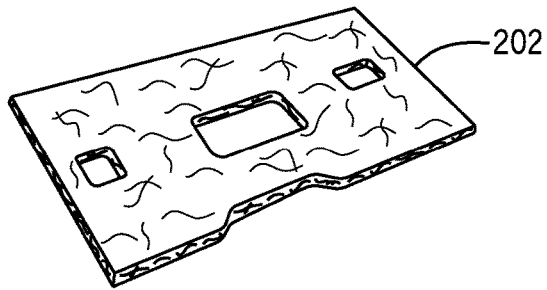
Figure 3D:
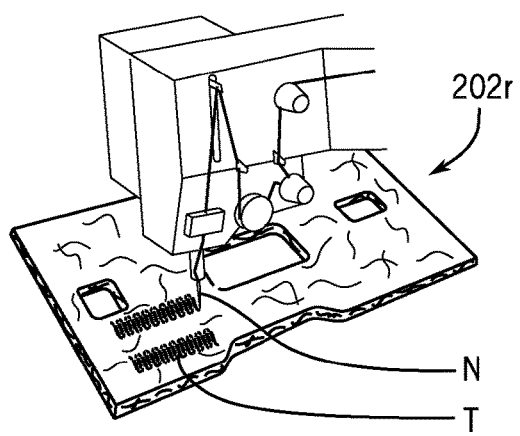
Figure 3E:
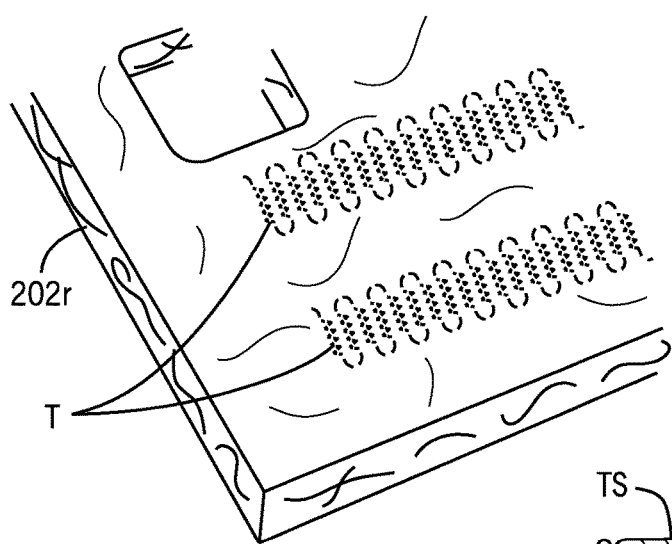
Figure 3F:
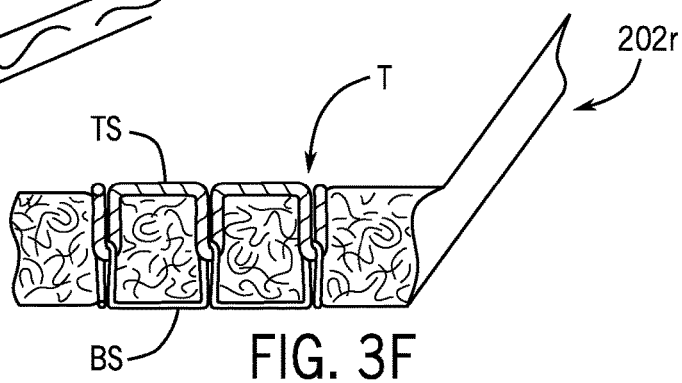

As shown schematically according to an exemplary embodiment in FIGS. 2A-2C and 3A-3F, the structural substrate 210 of the component (e.g. composite structure) may comprise a panel comprised at least partially of fibers; reinforcement T may be comprised of thread sewn to the panel (see FIGS. 3D-3F). As indicated schematically according to an exemplary embodiment in FIGS. 6A-6C and 7A-7C, the thread/reinforcement T (e.g. set of stitches, pattern/network of stitches, etc.) may be pressed into a surface of the panel during a compression forming process. See also FIGS. 4A-4C. As shown schematically in FIGS. 7D-7E, the panel may comprise a depression 210d; the thread/thread pattern (e.g. reinforcement) may be joined to the panel at depression 210d; the thread/pattern and the panel may form a generally continuous surface 1000s for trim component 1000.

As indicated schematically according to an exemplary embodiment in FIGS. 4A-4D, 6A-6C and 7A-7C, the structural substrate 210 may comprise a compression-formed component for the component/trim component (e.g. composite structure). As indicated schematically, the compression-formed component may comprise a recess 210r/RC in a back side 210b of structural substrate 210 configured to establish the opening so that the airbag will deploy through the compression-formed component at the opening. See e.g. FIGS. 1C-1F and 7A-7C. As shown schematically in FIGS. 3A-3F, 4A-4D, 6A-6C, 7A-7C and 8A-8E, the structural substrate 210 for the component may be formed at least partially from fibers (e.g. provided as a fiber mat, fiber panel, fiber web, etc.). As indicated schematically, the structural substrate 210 for the composite structure may comprise a generally rigid fiber mat. See FIGS. 3A-3F, 4A-4D, 6A-6C and 7A-7C.

As indicated schematically according to an exemplary embodiment in FIGS. 1C-1F and 7D, trim component 1000 may further comprise a cover C to provide a surface on a front side 210f of structural substrate 210; the cover C may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil.

As indicated schematically according to an exemplary embodiment in FIGS. 8A-8E, in operation of the airbag with the trim component contact between the airbag and the at least one door may induce tearing of cover C to establish the opening for the airbag and to facilitate deployment of the airbag through the opening in the trim component (e.g. through the composite structure); the airbag chute may be configured to define/provide at least one hinge area H for the at least one door; reinforcement T may be positioned adjacent the hinge area. See e.g. FIGS. 5A-5C.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a vehicle interior component 1000 may be produced in a mold M comprising a first surface and a second surface by a process comprising: placing a pre-form substrate 210 onto the first surface of the mold, forming a compression-formed structure/structural substrate 210 from pre-form substrate 210 by compressing pre-form substrate 210 between the first surface of the mold and the second surface of the mold, and applying a cover C to the compression-formed structure 210 to form a panel assembly 210/C providing a surface effect.

Figure 4A:
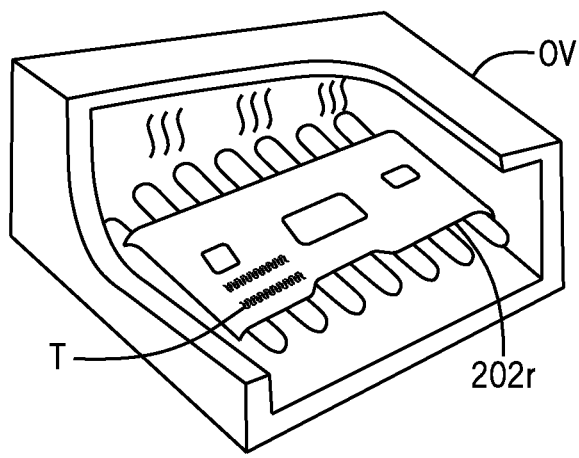
FIGS. 4A through 4C are schematic perspective views of a process to form a structural substrate from a reinforced fiber panel according to an exemplary embodiment.
Figure 4B:
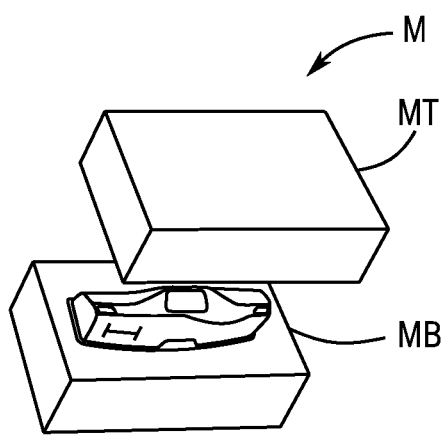
Figure 4C:
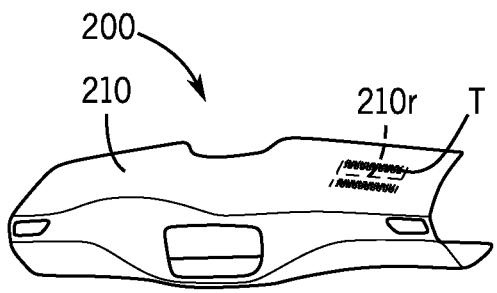
Figure 4D:
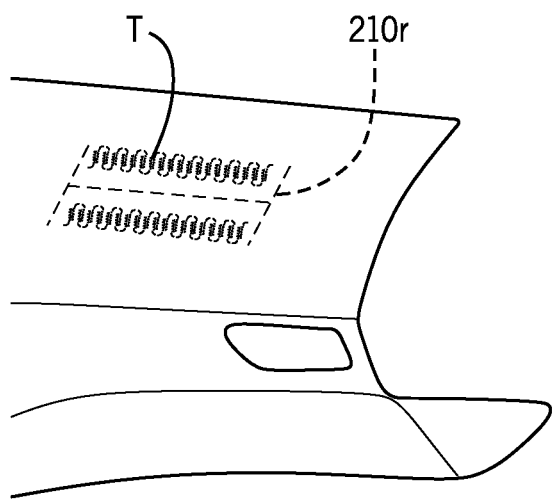
FIG. 4D is a schematic perspective cut-away view of a structural substrate according to an exemplary embodiment.

As indicated schematically in FIGS. 4A-4C, the pre-form substrate 210 for the composite structure for the component may comprise a reinforced pre-form substrate (e.g. with reinforcement by thread/stitch pattern, webs, strands, links, etc.); reinforcement T may comprise threads/material such as at least one of (a) KEVLAR, (b) aramid, (c) nylon, (d) polyester, (e) thread, (f) ceramic fibers, (h) polymeric fibers, (i) synthetic fibers. The pre-form substrate may comprise a panel comprised at least partially of fibers; reinforcement T may be comprised of thread sewn to the panel. See e.g. FIGS. 3A-3F. As shown schematically, the compression-formed structure may comprise a substrate layer and reinforcement T. See e.g. FIGS. 4A-4D. The reinforced pre-form substrate may comprise a surface effect comprising a generally smooth texture; the surface effect of the panel assembly may generally comprise the surface effect of the reinforced pre-from substrate; the step of forming the compression-formed structure may comprise forming reinforcement T and the pre-form substrate into a generally continuous surface 210s. See e.g. FIGS. 7A-7C. The substrate layer for the pre-form substrate may comprise a fiber mat; the substrate layer may comprise a generally rigid fiber mat; the step of forming the compression-formed structure may comprise forming the substrate layer into a generally rigid form; the surface effect of the panel assembly may comprise the generally rigid form of the substrate layer of the compression-formed structure. See e.g. FIGS. 3A-3F and 4A-4D. As indicated schematically in FIGS. 6A-6C and 7A-7F, the surface effect of the panel assembly may comprise a generally smooth texture and a generally rigid form; the generally smooth texture of the panel assembly may be provided by (a) a surface effect of cover C and (b) a surface effect of the pre-form substrate. See also FIGS. 1C-1F. According to an exemplary embodiment, cover C of the panel assembly may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil. As indicate schematically in FIGS. 1C and 4C, the compression-formed structure may comprise a shape; the panel assembly may comprise at least partially the shape of the compression-formed structure; the shape may comprise a first contour provided by the first surface of the mold and a second contour provided by the second surface of the mold. See e.g. FIGS. 4A-4C, 6A-6C and 7A-7F. As indicated schematically, the substrate layer for the pre-form substrate may comprise a fiber mat; the process may comprise the step of forming the pre-form substrate from a generally compressible fiber mat. See e.g. FIGS. 3A-3F, 4A-4D, 6A-6C and 7A-7F. According to an exemplary embodiment, the pre-form substrate may comprise natural fibers and a resin; the resin may comprise polypropylene; the natural fibers may comprise at least one of (a) flax; (b) kenaf. According to an exemplary embodiment, the pre-form substrate may comprise an area weight of between 1000 grams per square meter and 1800 grams per square meter; the pre-form substrate may comprise a thickness of between 1.5 mm and 4 mm; the compression-formed structure may comprise a thickness of between 0.8 mm and 3 mm. The process may comprise the step of heating the pre-formed substrate; the pre-formed substrate may be compressed as the pre-formed substrate cools; the process may comprise the step of injecting resin into the mold after the compression-formed structure is formed to form an ancillary component of the panel assembly. See e.g. FIGS. 11A-11B and 12.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a component for a vehicle interior configured to support an airbag module configured to deploy an airbag through an airbag chute by establishing a door providing an opening into the vehicle interior for the airbag may comprise a composite structure comprising a structural substrate 210 formed from a fiber panel and a cover C for structural substrate 210 providing an exterior surface. Structural substrate 210 may comprise a stitch pattern. The composite structure may be configured so that when the airbag is deployed from the airbag module the stitch pattern provides a reinforcement T for the door providing the opening so that the airbag can be deployed through the opening while the door remains at least partially attached to the composite structure. See e.g. FIGS. 1C-1F, 2A-2C, 8A-8E and 9A-9C.

As shown schematically according to an exemplary embodiment in FIGS. 2B, 3D-3F, 4A-4D, 5A-5C, 7A-7F, 8A-8E and 9A-9C, the reinforcement T may comprise a set of threads (e.g. stitch pattern, stitch network, etc.); the stitch pattern may provide reinforcement T at a hinge area H for the door; the stitch pattern may comprise a set of threads (e.g. pattern/network). As shown schematically, the set of threads for the stitch pattern may comprise a first set of threads and a second set of threads; the set of threads for the stitch pattern may comprise an upper set of threads and a lower set of threads; the upper set of threads may comprise a set of retaining threads and the lower set of threads may comprise a set of sacrificial threads. See e.g. FIGS. 2B, 3D-3F, 5A-5C and 8A-8E/9A-9C. As indicated schematically, the set of threads for the stitch pattern may comprise a set of retaining threads configured to stretch and a set of sacrificial threads configured to break; the door may remain at least partially attached to the composite structure by the set of retaining threads; the retaining threads may provide reinforcement T for the door; the sacrificial threads may be configured to rupture when the airbag establishes the door and the opening in the composite structure. See e.g. FIGS. 2B, 3D-3F, 5A-5C and 8A-8E/9A-9C. According to an exemplary embodiment, the set of threads for the stitch pattern may comprise a set of upper threads and a set of lower threads; the upper threads may provide a hinge for the door; the lower threads may comprise sacrificial threads configured to rupture when the airbag establishes the opening in the composite structure. See e.g. FIGS. 8A-8E. As shown schematically according to an exemplary embodiment, the stitch pattern may be provided on the fiber panel; the stitch pattern may be formed into structural substrate 210; the stitch pattern may be formed into structural substrate 210 so that the stitch pattern may not be visible at the exterior surface of cover C; the stitch pattern may comprise a network of threads in the fiber panel formed into structural substrate 210. See FIGS. 2B, 5A-5C and 7A-7F. As shown schematically in FIGS. 8A-8E, the reinforcement T provided by the stitch pattern may comprise reinforcement for the composite structure; the stitch pattern may comprise a first set of threads comprising a first thread weight and second set of threads comprising a second thread weight; the first thread weight may be larger than the second thread weight. According to an exemplary embodiment, the stitch pattern may comprise a set of retaining threads comprising 210 Tex thread and a set of sacrificial threads comprising 70 Tex thread. As indicated schematically, the set of retaining threads may be configured to stretch upon deployment of the airbag through the door for the composite structure; the stitch pattern may comprise a set of threads at least partially sewn into the fiber panel of structural substrate 210; the set of threads of the stitch pattern may be pressed into a surface of the fiber panel; the set of threads of the stitch pattern may be pressed into a surface of the fiber panel so that structural substrate 210 may comprise a generally flat surface for cover C; the set of threads of the stitch pattern may be pressed into a surface of the fiber panel so that the set of threads may not be visible at the exterior surface of cover C of the composite surface. See e.g. FIGS. 3A-3F, 4A-4D and 7A-7F. According to an exemplary embodiment, reinforcement T may comprise bonded nylon thread; the set of threads for the stitch pattern comprising at least one of (a) KEVLAR, (b) aramid, (c) nylon, (d) polyester, (e) thread, (f) ceramic fibers, (h) polymeric fibers, (i) synthetic fibers. According to an exemplary embodiment, the component may further comprise a notch (e.g. recess, interruption, line, score line, etc.) in structural substrate 210 configured to facilitate establishment of the opening for the airbag through the composite structure.

As shown schematically in FIGS. 4A-4F, the structural substrate 210 for the component (e.g. composite structure) may be formed into a shape; the component may further comprise a feature on structural substrate 210. As shown schematically in FIGS. 4E-4F, the feature may comprise the airbag chute and/or a resin-formed feature molded 220 on structural substrate 210. See also FIGS. 6A-6C and 7A-7F. According to an exemplary embodiment, the feature may comprise at least one of (a) the airbag chute; (b) a passage for the airbag; (c) a rib; (d) a set of ribs; (e) a feature adjacent to reinforcement T; (f) a feature at reinforcement T; (g) a feature at a hinge area; (h) a feature at the opening; (i) a feature configured to facilitate the opening; (j) a structure for the door; (k) a set of ribs configured to establish a seam for the door; (l) structure for a double door comprising the door; (m) the airbag chute at the hinge area; (n) a resin-formed feature. As indicated schematically, the door ABD may comprise a double door; the feature may comprise a seam to facilitate formation of the double door; the door may comprise a double door providing the opening for the airbag; reinforcement T may comprise a hinge area for each door of the double door. See e.g. FIGS. 1C-1F, 8A-8E and 9A-9C.

Figure 9A:
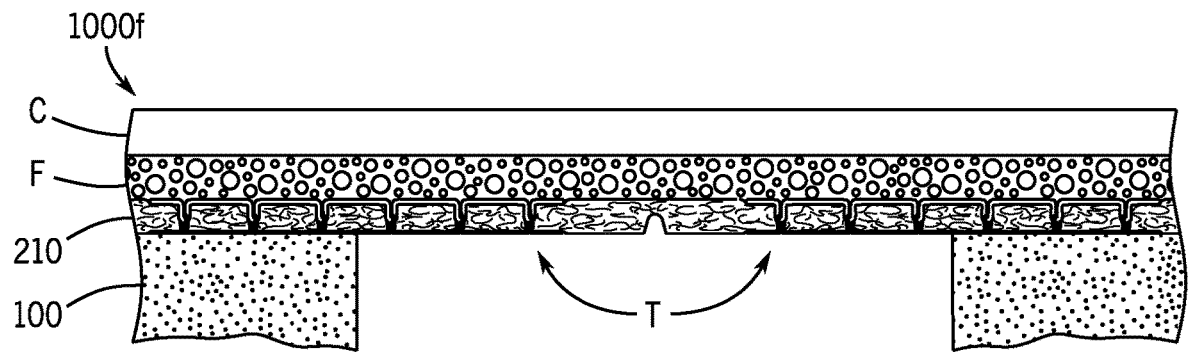
FIGS. 9A through 9C are partial schematic section views of a component for a vehicle interior according to an exemplary embodiment.
Figure 9B:
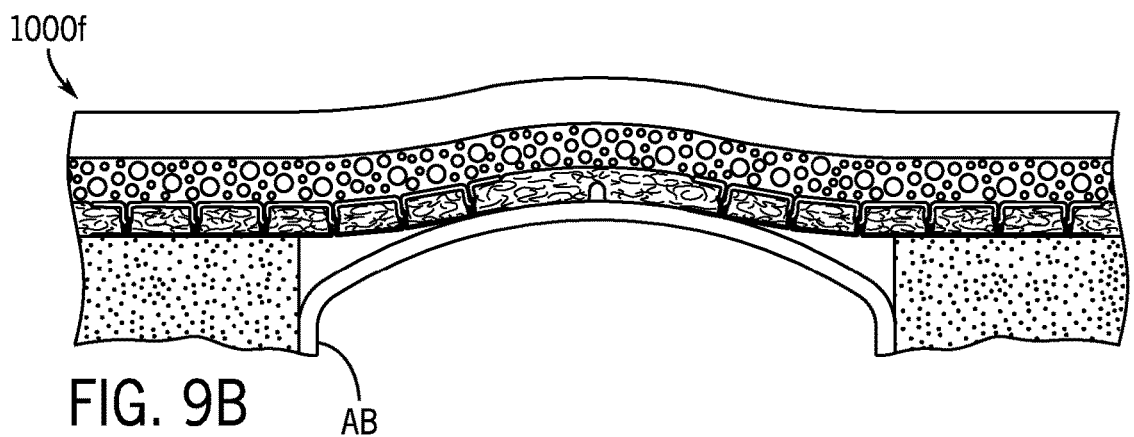
Figure 9C:
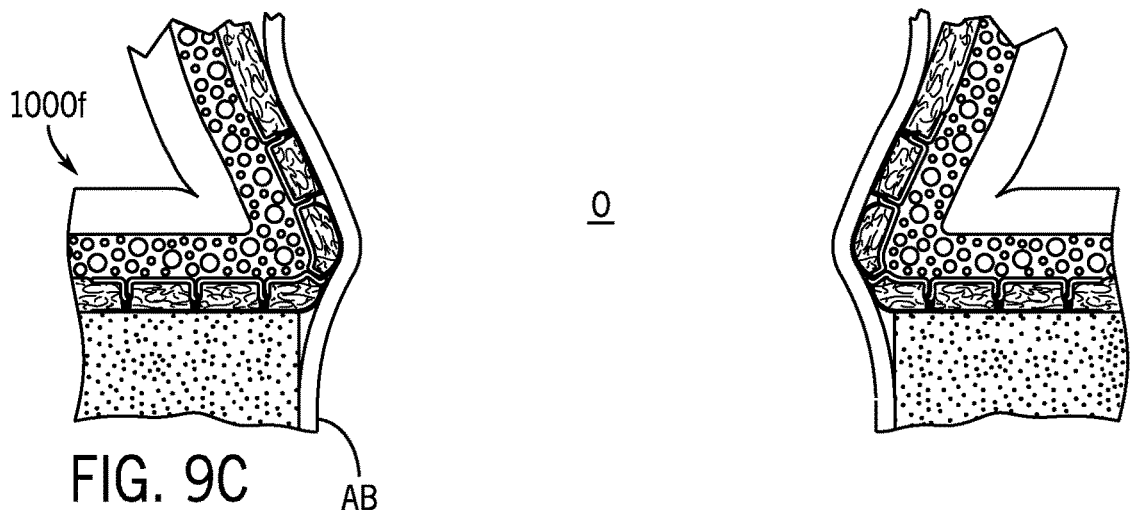

As shown schematically according to an exemplary embodiment in FIGS. 9A-9C, the composite structure further may comprise a foam layer F beneath cover C; reinforcement T may comprise a hinge area configured for the door established by deployment of the airbag through the airbag chute; structural substrate 210 may comprise a compression-formed component from the fiber panel; structural substrate 210 may comprise a generally rigid fiber mat. See also FIGS. 5A-5C and 8A-8E. According to an exemplary embodiment, cover C may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil; (l) coating on structural substrate 210; (m) paint on structural substrate 210; (n) the exterior surface of structural substrate 210. According to an exemplary embodiment, the component may comprise at least one of an instrument panel; a door panel; a trim panel; a trim component. See e.g. FIGS. 1A-1F.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a component for a vehicle interior configured to support an airbag module configured to deploy an airbag through an airbag chute by establishing a door providing an opening into the vehicle interior for the airbag may comprise a composite structure comprising a structural substrate 210 formed from a fiber panel, a cover C for structural substrate 210 providing an exterior surface and a feature formed from resin on structural substrate 210. Structural substrate 210 may comprise a reinforcement T; reinforcement T may be configured so that the door established by deployment of the airbag remains at least partially attached to the composite structure. As shown schematically according to an exemplary embodiment, reinforcement T may comprise a pattern of threads; the pattern of threads may be configured so that when the airbag is deployed from the airbag module the door remains at least partially attached to the composite structure by at least a portion of the pattern of threads; the pattern of threads may comprise a first stitch pattern and a second stitch pattern; the pattern of threads may comprise a set of stitches; the pattern of threads may comprise a stitch network; the stitch network may comprise a hinge for the door; the stitch network for reinforcement T may comprise a set of retaining threads and a set of sacrificial threads; the pattern of threads for reinforcement T may comprise a first set of threads and a second set of threads; the pattern of threads for reinforcement T may comprise a set of retaining threads and a set of sacrificial threads; the pattern of threads for reinforcement T may comprise a set of strong threads and a set of weak threads; the set of threads for reinforcement T may comprise a set of retaining threads and a set of sacrificial threads; the set of retaining threads may be configured to comprise reinforcement T after deployment of the airbag. See FIGS. 1C-1D, 2C, 3D-3F, 4A-4D, 5A-5C, 6A-6C, 7A-7F, 8A-8E, 9A-9C and 10A-10D.

As shown schematically, the reinforcement T may comprise a hinge area for the door; reinforcement T may comprise a hinge for the door. See e.g. FIGS. 8A-8E, 9A-9C and 10A-10D. According to an exemplary embodiment, the feature may comprise a resin-formed feature molded on structural substrate 210; the feature may comprise the airbag chute (shown as feature 100 and/or 220*r*); the resin-formed feature may comprise at least one of (a) the airbag chute; (b) a passage for the airbag; (c) a rib; (d) a set of ribs; (e) a feature adjacent to reinforcement T; (f) a feature at reinforcement T; (g) a feature at a hinge area; (h) a feature at the opening; (i) a feature configured to facilitate the opening; (j) structure for the door; (k) a set of ribs configured to establish a seam for the door; (l) structure for a double door comprising the door. See e.g. FIGS. 1C-1D, 2C, 3D-3F, 4A-4D, 5A-5C, 6A-6C, 7A-7F, 8A-8E, 9A-9C and 10A-10D.

As indicated schematically according to an exemplary embodiment in FIGS. 1C-1F, 6A-6C, 7A-7F, 8A-8E, 9A-9C and 10A-10D, the reinforcement for the structural substrate/fiber panel of the composite structure/component (e.g. configured for deployment of an airbag from an airbag chute through an opening established in the composite structure/component) may be provided with a thread pattern/arrangement T (such as comprising top threads and bottom threads shown as reinforcement/thread pattern). Compare FIGS. 8A-8E (pattern with reinforcement T with top threads TS and bottom threads BS) and FIG. 9A-9C (pattern for composite structure with foam layer and reinforcement/thread pattern T).

According to an exemplary embodiment as shown schematically in FIGS. 3A-3F, 4A-4D and 5A-5C, the fiber panel 202 (e.g. formed mat/panel/pad, lofted mat/panel/pad, uncompressed mat/pad, woven mat/pad, non-woven mat, pre-formed mat, compressed mat, etc.) for the structural substrate/compression-formed component 210 may be provided for forming a reinforcement/thread pattern T (e.g. by sewing, stitching, etc. of threads/fiber, etc.). As indicated schematically in FIGS. 8A-8E, the reinforcement/thread pattern T for the composite structure/component facilitates deployment of the airbag AB into the vehicle interior; top threads TS stretch and retain connection (e.g. at the opening/door established by deployment of the airbag) and bottom threads BS tear/rupture (e.g. stretch/release/separate). Compare FIGS. 9A-9C (composite structure with foam layer and corresponding reinforcement). According to an exemplary embodiment, the reinforcement/thread pattern may comprise threads in an arrangement with a variation in pattern/stitch or material or thickness/size or etc. (e.g. variations in strength, variations in Tex value (that may range between and beyond 70 Tex and 210 Tex), variations in density, variations in performance/properties, etc.); for example, the reinforcement/thread pattern may be configured with a top stitch that may tear/separate and a bottom stitch that may stretch/retain (e.g. a heavyweight bottom thread) or with an integrated pattern with threads/multiple threads that may exhibit suitable variations of strength/performance during deployment of the airbag through the composite structure/component from the airbag chute/module. See e.g. FIGS. 1C-1F, 8D-8E and 9A-9C.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a trim component for a vehicle interior configured to support an airbag module providing an airbag for deployment through an opening into the vehicle interior may be prepared using a mold by a process comprising the steps of: providing a pre-form substrate, joining a reinforcement T to the pre-form substrate in at least one hinge area to form a reinforced pre-form substrate, disposing the reinforced pre-form substrate onto a first surface of the mold, and compressing the reinforced pre-form substrate between the first surface and a second surface of the mold to form the reinforced pre-form substrate into a structural substrate 210 having a shape. According to an exemplary embodiment as shown schematically, the shape for the composite structure/trim component 1000 may correspond to a first contour of the first surface and a second contour of the second surface; structural substrate 210 for the composite structure may be configured to provide at least one door established upon deployment of the airbag to facilitate deployment of the airbag from the airbag module through the opening; reinforcement T for the composite structure may be configured to secure the at least one door to structural substrate 210 during deployment of the airbag. See FIGS. 1C-1F, 2C, 4A-4C and 6A-6C. According to an exemplary embodiment, the step of joining a reinforcement T to the pre-form substrate may comprise sewing at least one of a thread; a stitch to the pre-form substrate; the at least one of the thread or the stitch may be comprised of at least one of (a) KEVLAR, (b) aramid, (c) nylon, (d) polyester, (e) ceramic fibers, (f) polymeric fibers, (g) synthetic fibers. According to an exemplary embodiment, the step of joining a reinforcement T to the pre-form substrate may comprise piercing an opening in the pre-form substrate and joining a top stitch TS to a bottom stitch BS at the opening; top stitch TS may comprise a thread weight and bottom stitch BS may comprise a thread weight; the thread weight of top stitch TS may be generally greater than the thread weight of bottom stitch BS. According to an exemplary embodiment, the process may comprise the step of forming a recess in a surface of at least one of the pre-form substrate; structural substrate 210; the recess may be configured to facilitate deployment of the airbag.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a method of producing/manufacturing a vehicle trim component configured to support an airbag module providing an airbag for deployment from the airbag module through an opening into the vehicle interior may comprise the steps of: providing a pre-form substrate, joining a reinforcement T to the pre-form substrate in at least one hinge area to form a reinforced pre-form substrate, disposing the reinforced pre-form substrate onto a first surface of the mold, and compressing the reinforced pre-form substrate between the first surface and a second surface of the mold to form the reinforced pre-form substrate into a structural substrate 210 having a shape. The shape may correspond to a first contour of the first surface and a second contour of the second surface. Structural substrate 210 may be configured to provide at least one door established upon deployment of the airbag to facilitate deployment of the airbag from the airbag module through the opening. Reinforcement T may be configured to secure the door to structural substrate 210 during deployment of the airbag.

Figure 11A:
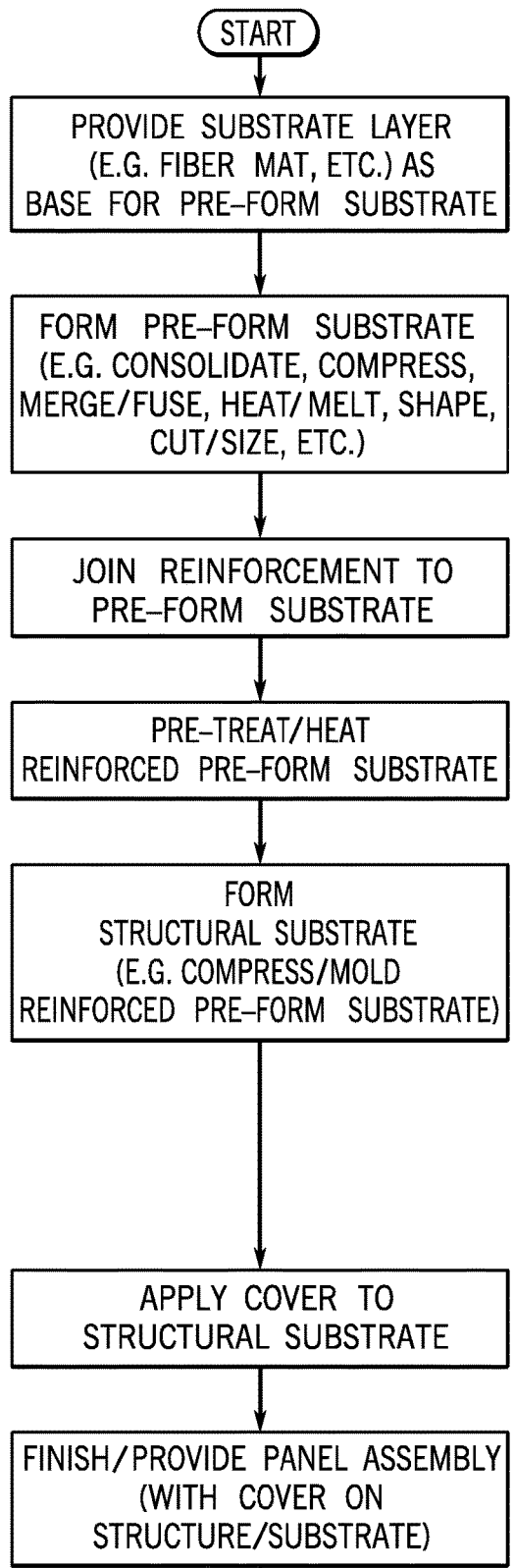
FIG. 11A is a schematic flow diagram of a method for forming a vehicle interior component according to an exemplary embodiment.

According to an exemplary embodiment as shown schematically in FIG. 11A, a method of manufacturing a vehicle trim component 1000 may comprise the steps of providing a substrate layer (e.g. fiber mat, etc.) as a base for a pre-form substrate, forming the pre-form substrate (e.g. consolidating, compressing, merging/fusing, heating/melting, shaping, cutting/sizing, etc.), joining a reinforcement to the pre-form substrate, pre-treating/heating the reinforced pre-form substrate, forming a structural substrate (e.g. compressing/molding the reinforced pre-form substrate), applying a cover to the structural substrate and finishing/providing a panel assembly (with the cover on the structure/substrate).

Figure 11B:
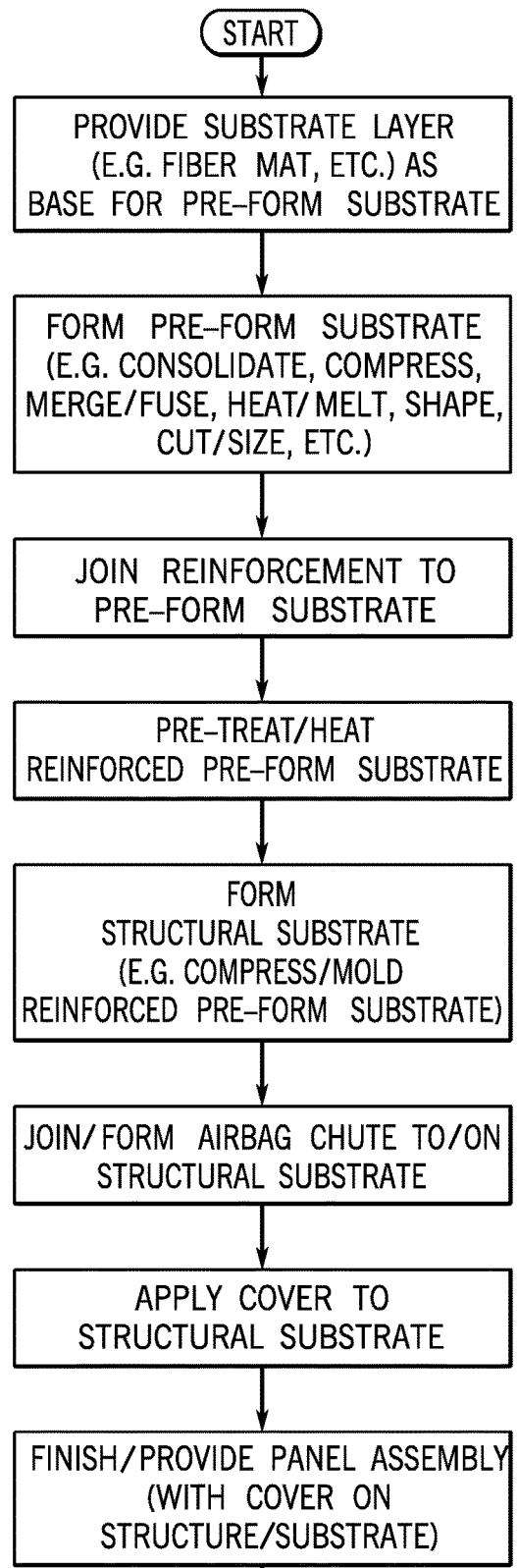
FIG. 11B is a schematic flow diagram of a method for forming a vehicle interior component according to an exemplary embodiment.

According to an exemplary embodiment as shown schematically in FIG. 11B, a method of manufacturing a vehicle trim component 1000 may comprise the steps of providing a substrate layer (e.g. fiber mat, etc.) as a base for a pre-form substrate, forming the pre-form substrate (e.g. consolidating, compressing, merging/fusing, heating/melting, shaping, cutting/sizing, etc.), joining a reinforcement to the pre-form substrate, pre-treating/heating the reinforced pre-form substrate, forming a structural substrate (e.g. compressing/molding the reinforced pre-form substrate), joining/forming an airbag chute to/on the structural substrate, applying a cover to the structural substrate and finishing/providing a panel assembly (with the cover on the structure/substrate).

Figure 12:
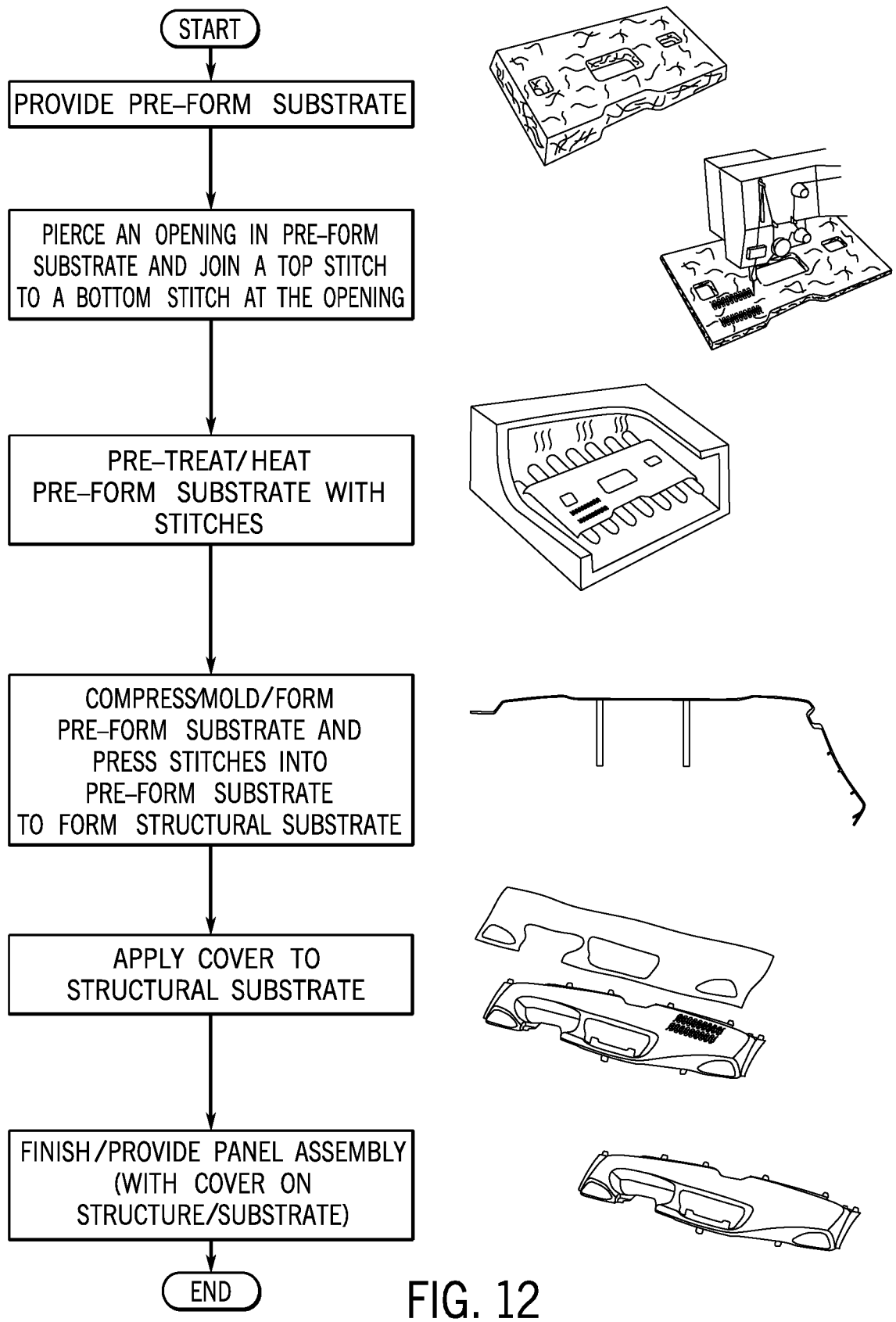
FIG. 12 is a schematic flow diagram of a method for forming a vehicle interior component according to an exemplary embodiment.

According to an exemplary embodiment as shown schematically in FIG. 12, a method of manufacturing a vehicle trim component 1000 may comprise the steps of providing a pre-form substrate, piercing an opening in the pre-form substrate and joining a top stitch to a bottom stitch at the opening, pre-treating/heating the pre-form substrate with the top and the bottom stitch, compressing/molding/forming the pre-form substrate and pressing the top stitch and the bottom stitch into the pre-form substrate to form a structural substrate, applying a cover to the structural substrate, and finishing/providing a panel assembly (with the cover on the structure/substrate).

Exemplary Embodiments—B

Referring to FIGS. 1A and 1B, a vehicle V is shown schematically with an interior I comprising components such as trim components, panels, consoles, etc. As indicated schematically according to an exemplary embodiment in FIGS. 13A-13B, the vehicle interior may comprise a component such as a trim panel shown as instrument panel IP configured to provide a base B with a moveable panel/door D to provide access into an opening O. See also FIGS. 14A-14B and 18A-18B.

As shown schematically according to an exemplary embodiment in FIGS. 14A-14B, 15A-15F, 16A-16E, 18A-18B, 19 and 20, the component may comprise a substrate such as a fiber panel FP formed with a reinforcement T (e.g. fiber/thread, etc.) shown as provided in a stitch/stitch pattern ST at a hinge area H for a hinge HG (shown as a living hinge) for the moveable panel/door D.

According to an exemplary embodiment as shown schematically in FIGS. 13A-13B, 14A-14B, 15A-15F, 16A-16E, 17A-17E, 18A-18D, 19 and 20, a component such as a trim component shown as instrument panel IP for a vehicle interior may be configured to provide a panel D configured to be moved between a closed position and an open position relative to a base B to provide an opening O. As shown schematically in FIGS. 13A-13B, 14A-14B and 18A-18D, the panel D may comprise a structural substrate shown as comprising a fiber panel FP the panel D and a hinge area H for the panel D; and a reinforcement T for the panel at the hinge area; the reinforcement T may comprise a stitch pattern ST configured to reinforce the hinge area during movement of the panel; the hinge area may comprise a hinge HG; the hinge may comprise material of the structural substrate and the reinforcement; the stitch pattern of the reinforcement may comprise thread sewn into the structural substrate; the panel may comprise a door. The structural substrate may comprise a surface for the stitch pattern; the stitch pattern may be pressed into the surface of the structural substrate. See FIGS. 15A-15F and 16A-16E. As indicated schematically in FIGS. 19 and 20, the structural substrate may comprise at least one of (a) a compression-formed component; (b) a generally rigid fiber mat; (c) a fiber panel. The structural substrate may comprise a base; the panel may be configured to be movable relative to the base; the reinforcement may be configured to reinforce the panel to the base at the hinge. As indicated schematically in FIGS. 13A-13B, 14A-14B and 18A-18B, the component may comprise a cover providing an exterior surface; the stitch pattern may be concealed at the exterior surface by the cover. The reinforcement may be comprised of at least one of (a) KEVLAR, (b) aramid, (c) nylon, (d) polyester, (e) thread, (f) ceramic fibers, (g) polymeric fibers, (h) synthetic fibers. The stitch pattern may comprise a sewn thread pattern in the base. The component may comprise at least one of an instrument panel, a door panel, a trim panel, a trim component, a trim component wherein the panel comprises a door (e.g. formed during manufacture); a trim component wherein the panel comprises an airbag door (e.g. established during airbag deployment). See also FIGS. 1C-1F and 13A-13B.

As indicated schematically in FIGS. 16A-16E, the component may be formed by a process comprising the step of injecting resin into a mold after a compression-formed structure comprising the structural substrate is formed to form an ancillary component of a composite structure. See also FIGS. 19 and 20.

According to an exemplary embodiment as shown schematically in FIGS. 13A-13B, 14A-14B, 15A-15F, 16A-16E, 17A-17E, 18A-18D, 19 and 20, a component for a vehicle interior such as a trim component shown as instrument panel IP configured to provide a panel D configured to be moved between a closed position and an open position may be prepared in a mold M providing a first mold surface MT and a second mold surface MB by a method comprising the steps of providing a substrate 202/FP comprising a base, forming the substrate with a hinge area H so that the panel D may be configured to be movable relative to the base of the substrate at the hinge area H, joining a reinforcement T in the substrate at the hinge area for the panel and compressing the substrate between the first mold surface and the second mold surface of the mold to form a structural substrate having a shape (see FIGS. 16A-16B); the shape of the structural substrate may be formed at least partially by the first mold surface and the second mold surface; the reinforcement at the hinge area for the panel may be configured to secure the panel to the base for movement between the closed position and the open position; the step of joining the reinforcement T in the substrate may comprise sewing a stitch pattern ST in the substrate (see FIGS. 15A-15F); the step of forming the substrate may comprise at least partially cutting the panel from the base of the substrate with a cut CT (see FIG. 20); the hinge area may comprise a hinge HG and the panel may comprise a door D; the hinge HG may comprise a living hinge formed in the base of the substrate (see FIGS. 14A-14B and 18A-18B); the hinge may comprise material from the substrate reinforced by the stitch pattern ST of the reinforcement T. As indicated schematically according to an exemplary embodiment in FIGS. 17A-17E, 18A-18B, 19 and 20, the hinge area H of the component may comprise a recess RC in the substrate; the step of forming the substrate may comprise at least partially cutting the panel from the base of the substrate with a cut CT and at least partially retaining material for a hinge HG for the panel D at the hinge area H; the substrate may comprise a pre-form substrate; the substrate may comprise a fiber panel. See also FIGS. 13A-13B. As indicated schematically in FIGS. 13A-13B, 14A-14B, 18A-18B, 19 and 20, the method may comprise the step of providing a cover layer C on the substrate FP; the stitch pattern ST of the reinforcement R may be at least partially concealed by the cover layer; the step of providing a cover layer on the substrate may comprise molding the cover layer on the substrate. As indicated schematically in FIGS. 15A-15F, 19 and 20, the step of joining the reinforcement T in the substrate may comprise sewing a stitch pattern ST in a surface of the substrate; the method may comprise the step of providing a molded cover on an outer surface of the substrate configured to conceal the stitch pattern in the inner surface of the substrate.

According to an exemplary embodiment as shown schematically in FIGS. 13A-13B, 14A-14B, 15A-15F, 16A-16E, 17A-17E, 18A-18D, 19 and 20, a component for a vehicle interior configured to provide a panel D configured to be moved between a closed position and an open position may comprise a structural substrate formed from a fiber panel FP and a cover C for the structural substrate providing an exterior surface; the structural substrate may comprise a hinge HG for the panel and a stitch pattern ST at the hinge; the stitch pattern may comprise a thread T; the stitch pattern ST may be configured to provide a reinforcement T at the hinge when the panel is rotated between the closed position and the open position. As indicated schematically in FIGS. 13A-13B, 19 and 20, the stitch pattern ST may be formed into the structural substrate so that the stitch pattern is not visible at the exterior surface of the cover.

Exemplary Embodiments—C

According to an exemplary embodiment as shown schematically in FIG. 3A, a fiber mat 202*u* may comprise a combination of fibers (e.g. natural and/or synthetic fibers) and thermoplastic resin (e.g. polypropylene (PP), acrylonitrile butadiene styrene (ABS), polycarbonate (PC), etc.). According to an exemplary embodiment as shown schematically in FIG. 3B, fiber mat 202*u* may be trimmed into a fiber mat 202*t* having a thickness. According to an exemplary embodiment, fiber mat 202*t* may be heated to induce the thermoplastic resin to liquefy. According to an exemplary embodiment as shown schematically in FIG. 3C, heated fiber mat 202*t* may be partially compressed into a fiber panel 202 having a thickness less than the thickness of fiber mat 202*t*. According to an exemplary embodiment as shown schematically in FIGS. 3D through 3F, a reinforcement T comprising at least one of (a) KEVLAR, (b) aramid, (c) nylon, (d) polyester, (e) thread, (f) ceramic fibers, (g) polymeric fibers, (h) synthetic fibers, (i) a stitch may be sewn to fiber panel 202 to form reinforced fiber panel 202*r*.

According to an exemplary embodiment as shown schematically in FIG. 4A, reinforced fiber panel 202*r* may be heated in an oven OV. As shown schematically in FIG. 4B, heated reinforced fiber panel 202*r* may be transferred into a mold having a mold top MT and mold bottom MB. According to an exemplary embodiment as shown schematically in FIGS. 4C and 4D, a component shown as an instrument panel substrate 200 may be produced by a process of compression forming heated reinforced fiber panel 202*r* into a structural substrate 210 and injection molding resin onto compression formed heated reinforced fiber panel 202*r*. A recess 210*r* of structural substrate 210 may be formed in the process. Recess 210*r* may define a door to be established upon deployment of an airbag to facilitate deployment of the airbag from an airbag module through an opening. Reinforcement T may be configured to secure the door to structural substrate 210 during deployment of the airbag.

Figure 4E:
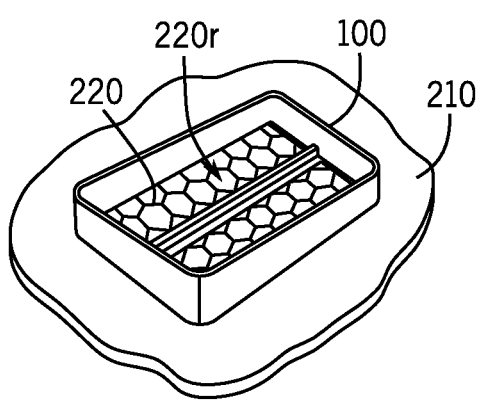
FIGS. 4E through 4F are schematic perspective cut-away views of a component for a vehicle interior according to an exemplary embodiment.
Figure 4F:
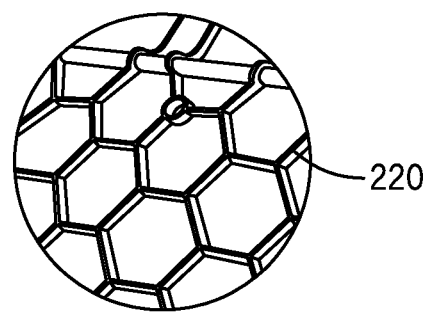
Figure 5A:
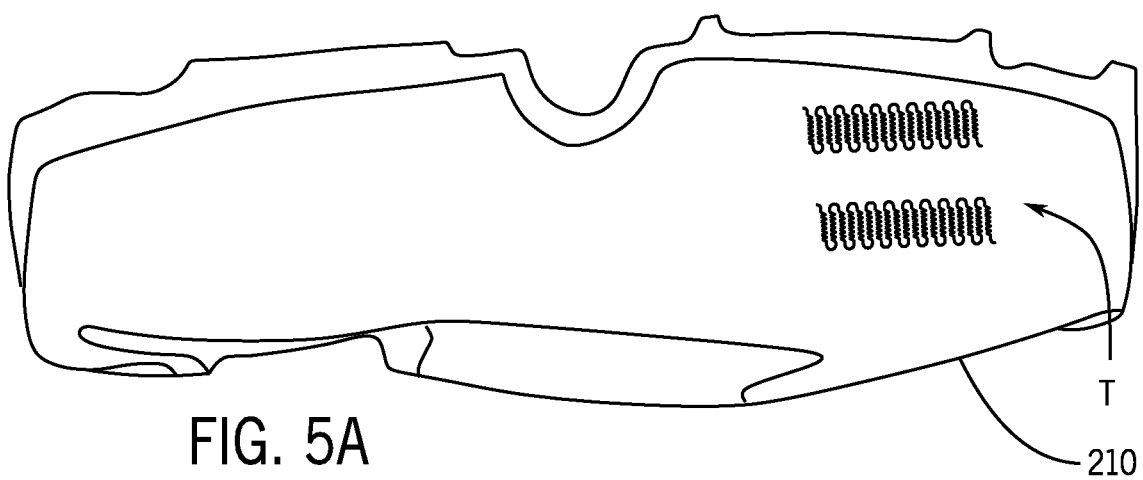
FIG. 5A is a schematic perspective view of a structural substrate according to an exemplary embodiment.
Figure 5B:
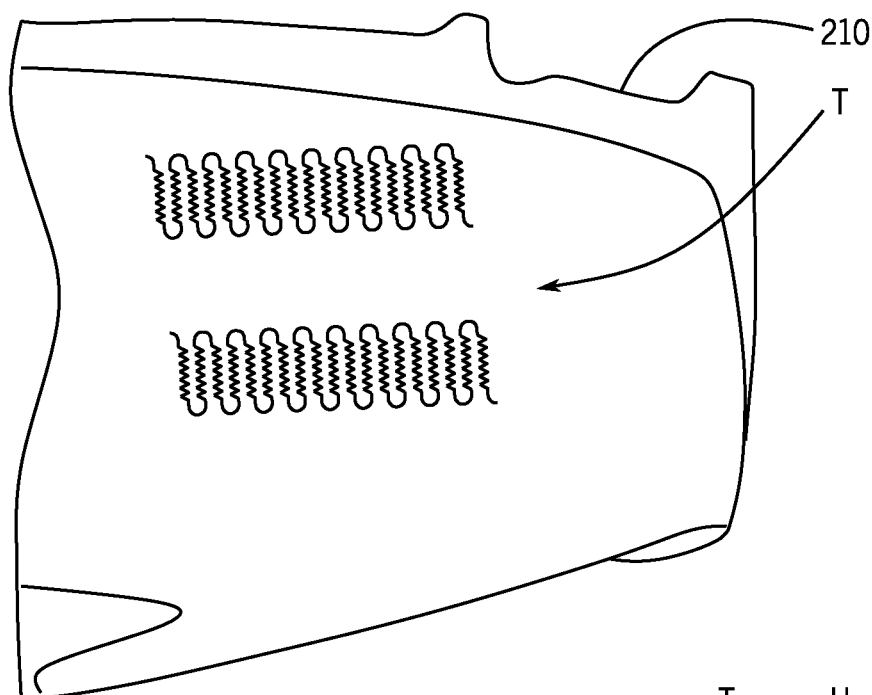
FIG. 5B is a schematic partial perspective view of a structural substrate according to an exemplary embodiment.
Figure 5C:
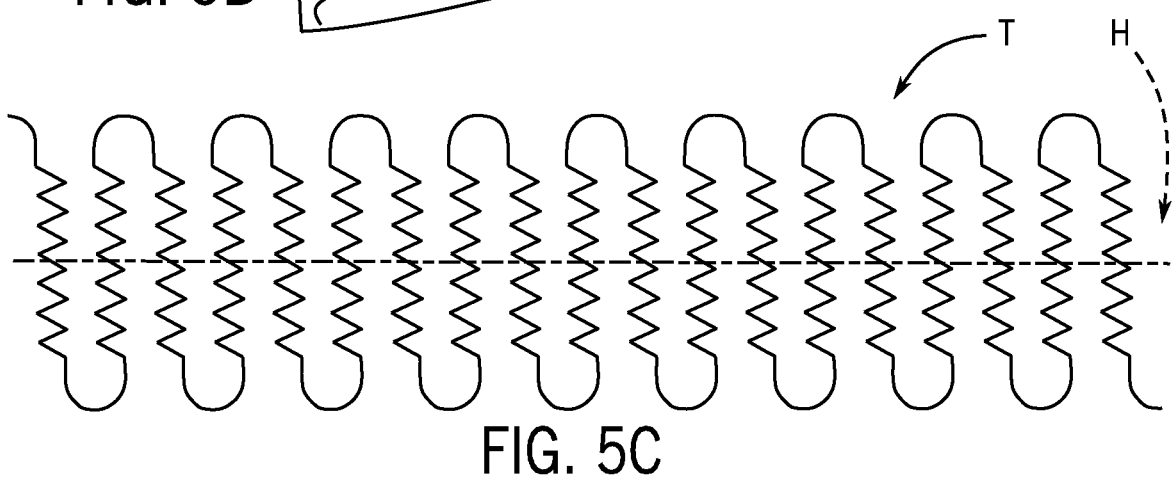
FIG. 5C is a schematic partial plan view of a reinforcement for a structural substrate according to an exemplary embodiment.
Figure 6A:
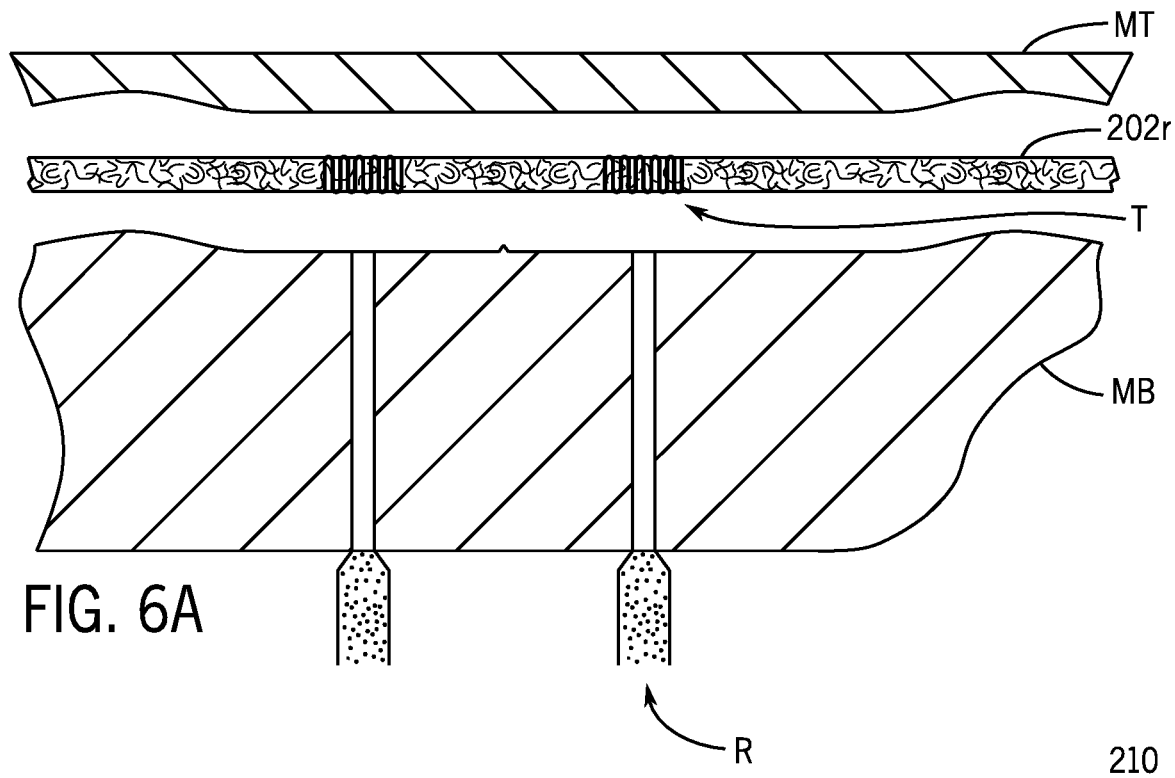
FIGS. 6A through 6C are schematic partial section views of a process to form a structural substrate with an airbag chute from a reinforced fiber panel according to an exemplary embodiment.
Figure 6B:
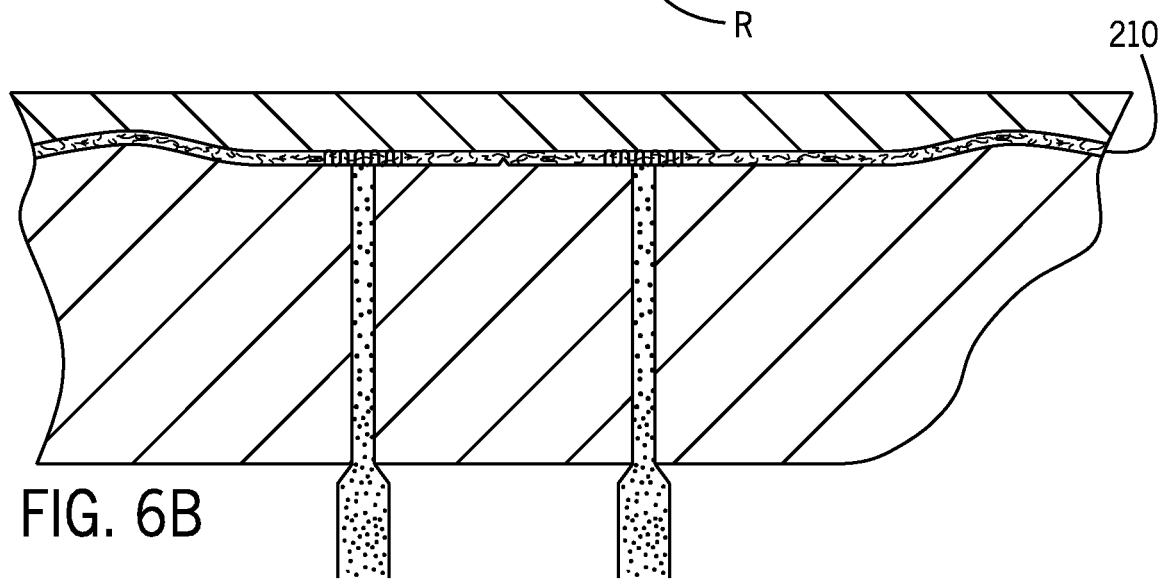
Figure 6C:
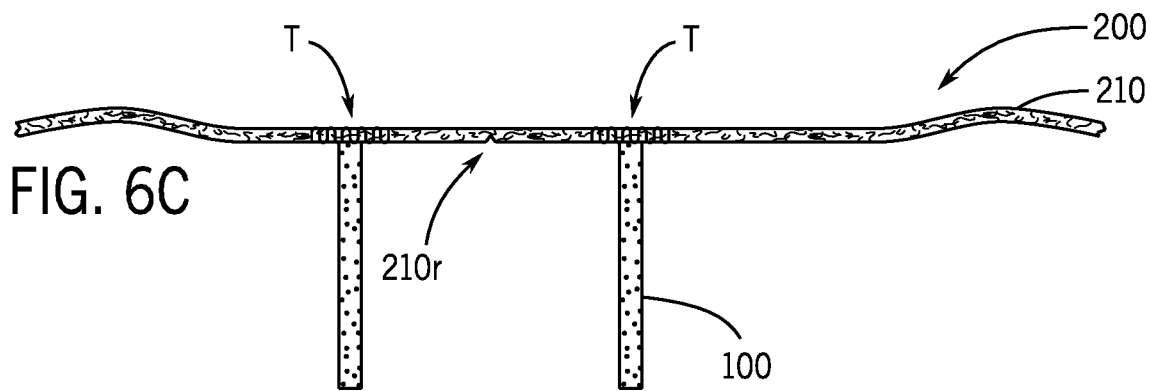
Figure 8A:
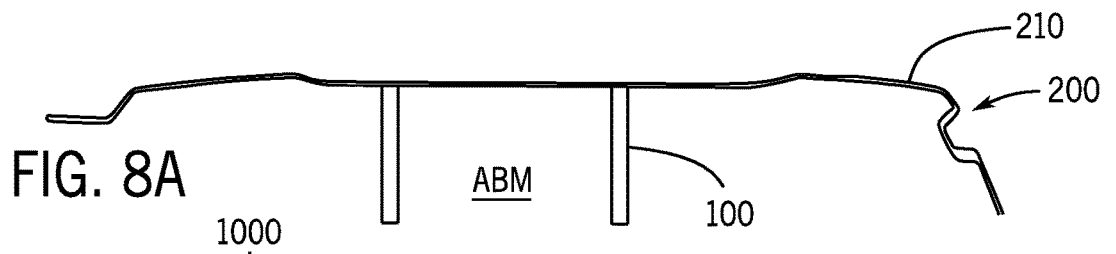
FIG. 8A is a schematic partial section view of a vehicle interior component shown as an instrument panel according to an exemplary embodiment.
Figure 8B:
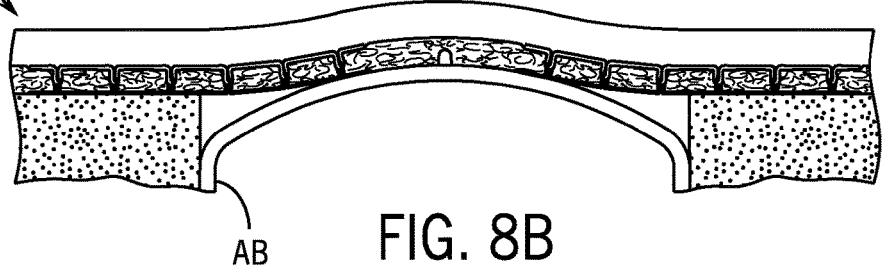
FIGS. 8B through 8D are schematic partial section views of an airbag deployment according to an exemplary embodiment.
Figure 8C:
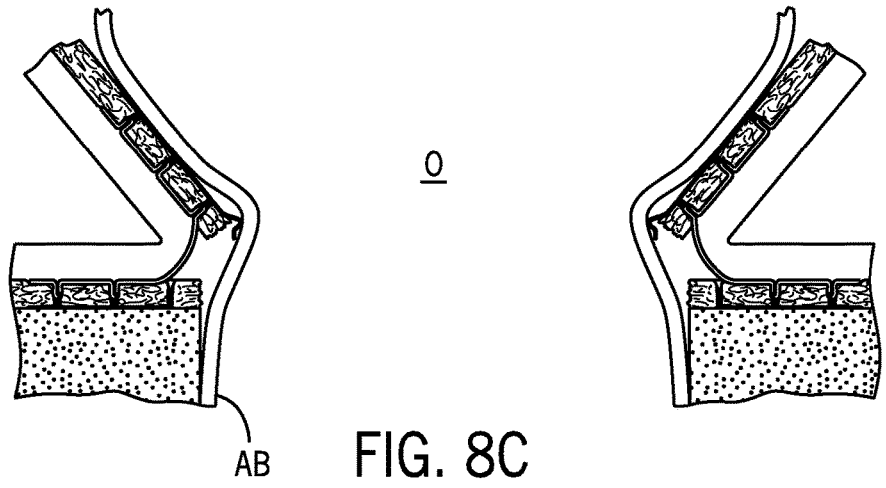
Figures 8D, 8E:
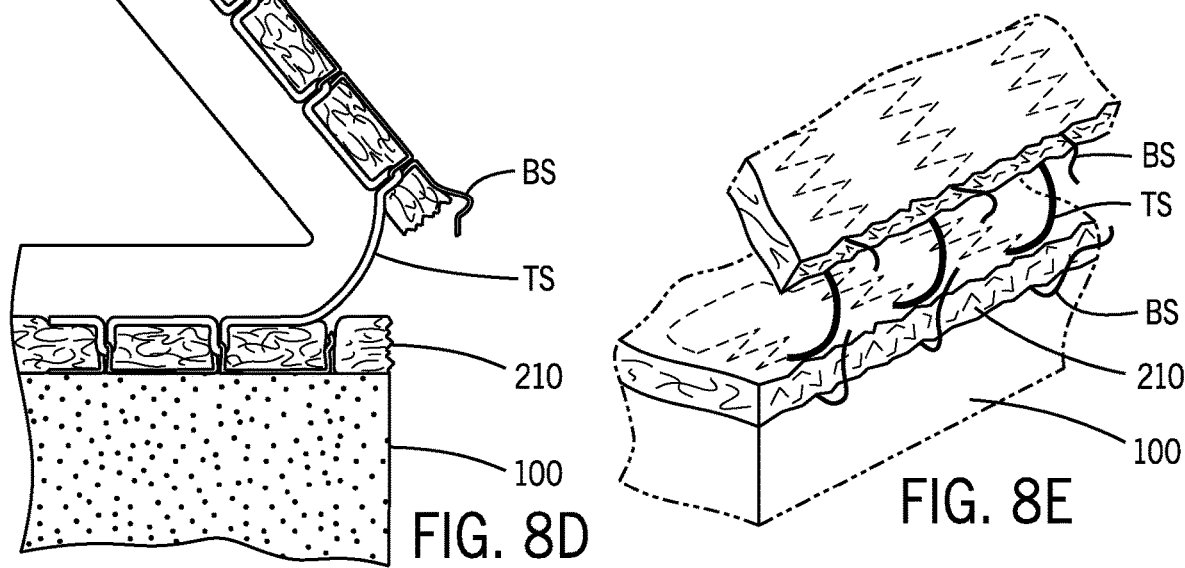
FIG. 8E is a schematic partial perspective view of a vehicle interior component shown as an instrument panel according to an exemplary embodiment.

According to an exemplary embodiment as shown schematically in FIGS. 4E and 4F, instrument panel substrate 200 may provide a feature shown as a plastic rib 220 on a back side of structural substrate 210 to improve structural integrity and rigidity of structural substrate 210. Structural substrate 210 may be configured to support an airbag chute 100 and an airbag module comprising an airbag. As shown schematically in FIG. 10A, plastic rib 220 may comprise a reinforcement 220r to provide structural support; plastic rib 220 may comprise a border 220b to provide reinforcement and/or dimensional accuracy for structural substrate 210. According to an exemplary embodiment, plastic rib 220 may be placed at any location on structural substrate 210 (e.g. along an edge of structural substrate 210, in the middle of structural substrate 210, etc.). According to an exemplary embodiment, multiple plastic ribs 220 may be placed at various different locations on structural substrate 210. According to an exemplary embodiment, plastic rib 220 may improve structural integrity of instrument panel substrate 200. According to an exemplary embodiment, instrument panel substrate 200 may be able to maintain structural integrity during an airbag deployment; the position/placement of plastic rib 220 may be intended to create a strength differential between different areas of instrument panel substrate 200; energy needed for an airbag to break through a vehicle interior component 1000 may be directed to recess 210r of structural substrate 210; plastic rib 220 may prevent or minimize ripping or tearing of structural substrate 210 at any location other than at recess 210r during an airbag deployment. According to an exemplary embodiment as shown schematically in FIG. 4F, plastic rib 220 may form a honeycomb shaped pattern to improve structural integrity and rigidity. According to an exemplary embodiment, plastic rib 220 may be formed in any configuration according to a specific application (e.g. ancillary features for attaching air vents, speakers or infotainment system, etc.).

According to an exemplary embodiment as shown schematically in FIGS. 10A-10D, a trim component 1000 for a vehicle interior may be configured to support an airbag chute and an airbag module providing an airbag AB configured to be deployed through an opening into the vehicle interior. Trim component 1000 may comprise a structural substrate 200 providing a front side, a back side and at least one door established upon deployment of airbag AB to facilitate deployment of airbag AB from the airbag module through the opening. Structural substrate 200 may comprise a reinforcement T configured to secure the door to structural substrate 200 during deployment of airbag AB. Reinforcement T may comprise at least one stitch. Reinforcement T may be comprised of at least one of (a) KEVLAR, (b) aramid, (c) nylon, (d) polyester, (e) thread, (f) ceramic fibers, (g) polymeric fibers, (h) synthetic fibers. Structural substrate 200 may comprise a panel 202 comprised at least partially of fibers. Reinforcement T may be comprised of thread sewn to panel 202. Structural substrate 200 may comprise a compression-formed component 210. Compression-formed component 210 may comprise a recess 210r in the back side of structural substrate 200 configured to establish the opening so that airbag AB will deploy through compression-formed component 210 at the opening. Structural substrate 200 may be formed at least partially from fibers. Trim component 1000 may comprise a cover C to provide a surface on the front side of structural substrate 200. Contact between airbag AB and the door may induce tearing of cover C to establish the opening for the airbag and may facilitate deployment of airbag AB through the opening.

According to an exemplary embodiment as shown schematically in FIGS. 3A-3F, 4A-4F and 10A-10D, a trim component 1000 for a vehicle interior configured to support an airbag module providing an airbag AB for deployment through an opening into the vehicle interior may be prepared using a mold M by a process. The process may comprise the steps of providing a fiber panel 202, joining a reinforcement T to fiber panel 202 in at least one hinge area to form a reinforced fiber panel 202r, disposing reinforced fiber panel 202r onto a first surface of mold M, compressing reinforced fiber panel 202r between the first surface and a second surface of mold M to form reinforced fiber panel 202r into a structural substrate 200 having a shape and attaching a structure 100 on a side of structural substrate 200. The shape may correspond to a first contour of the first surface and a second contour of the second surface. Structural substrate 200 may be configured to provide at least one door established upon deployment of airbag AB to facilitate deployment of airbag AB from the airbag module through the opening. Structure 100 may be configured to support the airbag module and to direct airbag AB toward structural substrate 200 to establish the opening and the door during deployment of airbag AB. Reinforcement T may be configured to secure the door to structural substrate 200 during deployment of airbag AB. Joining reinforcement T to fiber panel 202 may comprise sewing at least one of a thread; a stitch to fiber panel 202. The at least one of the thread; the stitch may be comprised of at least one of (a) KEVLAR, (b) aramid, (c) nylon, (d) polyester, (e) ceramic fibers, (f) polymeric fibers, (g) synthetic fibers. Attaching structure 100 on a side of structural substrate 200 may comprise injecting resin into mold M. The process may comprise the step of forming a recess 210r in a surface of at least one of fiber panel 202; reinforced fiber panel 202r; recess 210r may be configured to facilitate deployment of airbag AB.

According to an exemplary embodiment as shown schematically in FIGS. 3A-3F, 4A-4F and 10A-10D, a method of manufacturing a vehicle trim component 1000 configured to support an airbag module providing an airbag AB for deployment from the airbag module through an opening into the vehicle interior may comprise the steps of providing a fiber panel 202, joining a reinforcement T to fiber panel 202 in at least one hinge area to form a reinforced fiber panel 202r, disposing reinforced fiber panel 202r onto a first surface of a mold M, compressing reinforced fiber panel 202r between a first surface and a second surface of the mold to form reinforced fiber panel 202r into a structural substrate 200 having a shape and attaching a structure 100 on a side of the structural substrate. The shape may correspond to a first contour of the first surface and a second contour of the second surface. Structural substrate 200 may be configured to provide at least one door established upon deployment of the airbag to facilitate deployment of the airbag from the airbag module through the opening. Structure 100 may be configured to support the airbag module and may direct airbag AB toward structural substrate 200 to establish the opening and the door during deployment of airbag AB. Reinforcement T may be configured to secure the door to structural substrate 200 during deployment of the airbag.

Exemplary Embodiments—D

Referring to FIGS. 1A-1B and 13A-13B, a vehicle V is shown including an interior I with vehicle interior components shown as trim components such as an instrument panel IP, doors D and a floor console FC; according to an exemplary embodiment, components of vehicle V such as instrument panel IP and doors D may include trim components/panels comprised of fiber and plastic. According to an exemplary embodiment as shown schematically in FIGS. 13A-13B, trim components such as instrument panel IP and doors may provide visible surfaces in the vehicle interior of vehicle V. According to an exemplary embodiment, vehicle interior/trim components such as instrument panel IP and/or doors may provide at least one moveable panel/door D and a hinge area H with living hinge for the panel/door. See FIGS. 13A-13B. 14A-14B and 18A-18B.

According to an exemplary embodiment as shown schematically in FIGS. 13A-13B, instrument panel IP may provide a panel/door D and a living hinge HG at a hinge area H for the panel/door D; the living hinge HG (e.g. a line, score line, cut, notch, groove, discontinuity, interruption, etc.) may be configured to facilitate rotation of the panel/door. According to an exemplary embodiment, instrument panel IP may comprise a base B and a reinforcement T to secure the panel/door D at the living hinge HG for movement relative to the base. See FIGS. 14A-14B and 18A-18B.

Figure 15A:
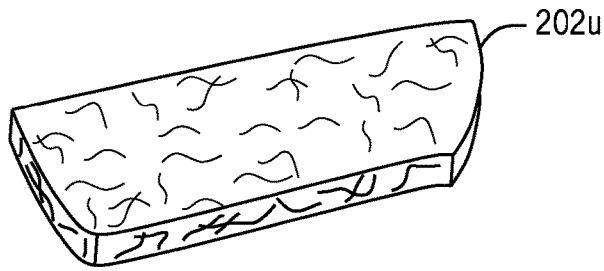
FIGS. 15A through 15F are schematic perspective views of a process to form a reinforced fiber panel according to an exemplary embodiment.
Figure 15B:
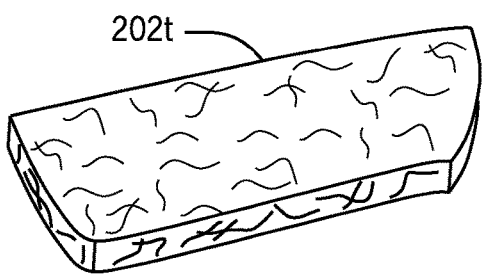
Figure 15C:
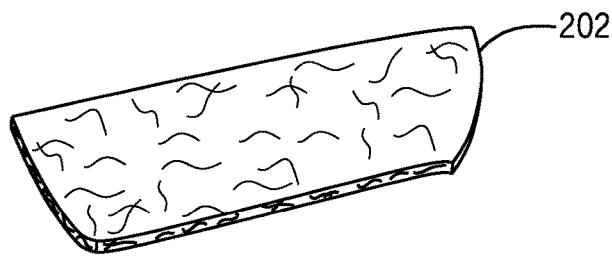
Figure 15D:
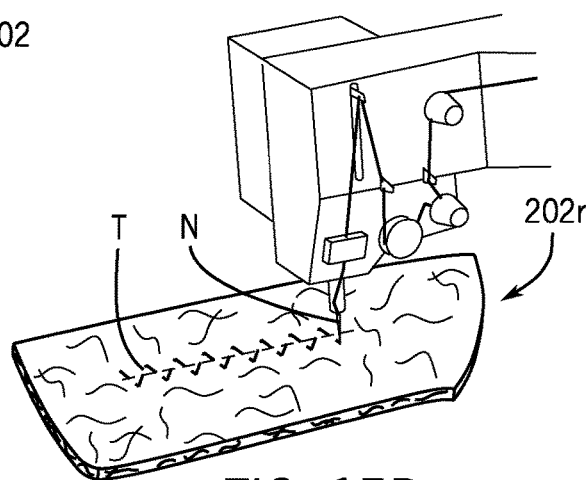
Figure 15E:
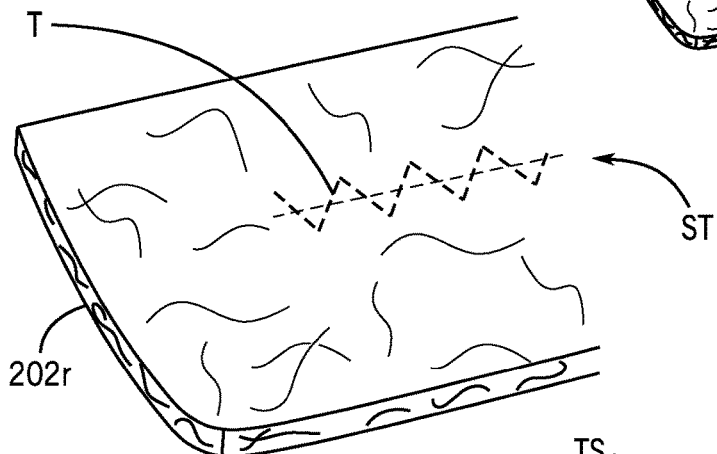
Figure 15F:
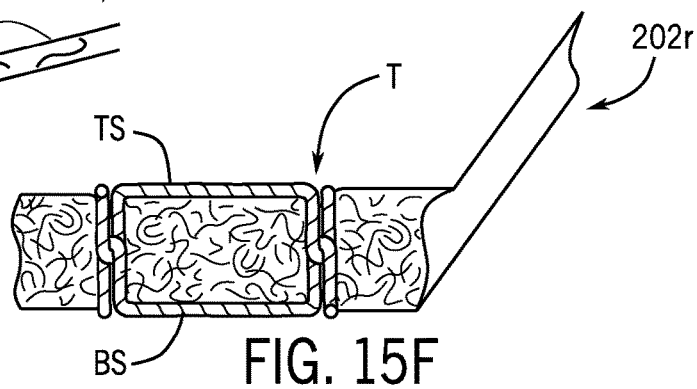
Figure 17A:
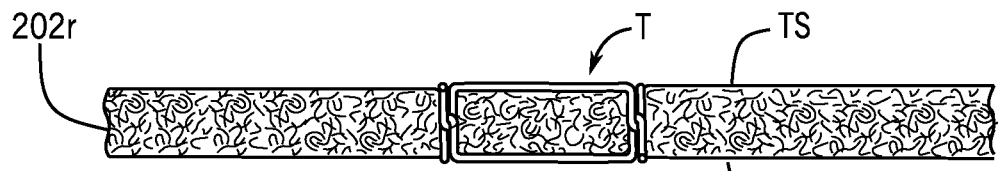
FIGS. 17A through 17E are schematic partial section views of a process to form a vehicle interior component according to an exemplary embodiment.
Figure 17B:
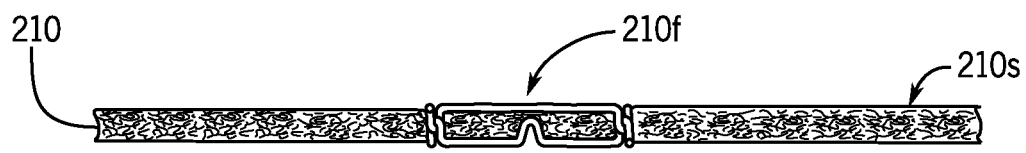
Figure 17C:
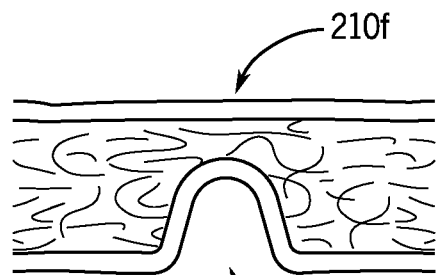
Figure 17D:
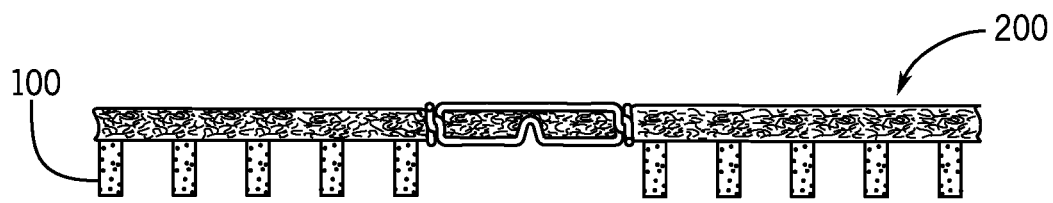
Figure 17E:
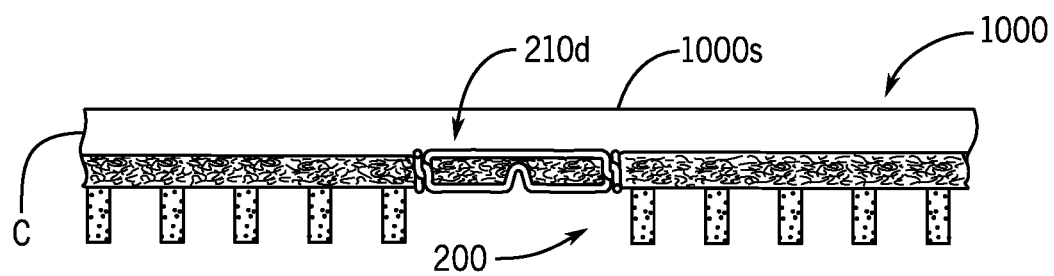
Figure 19:
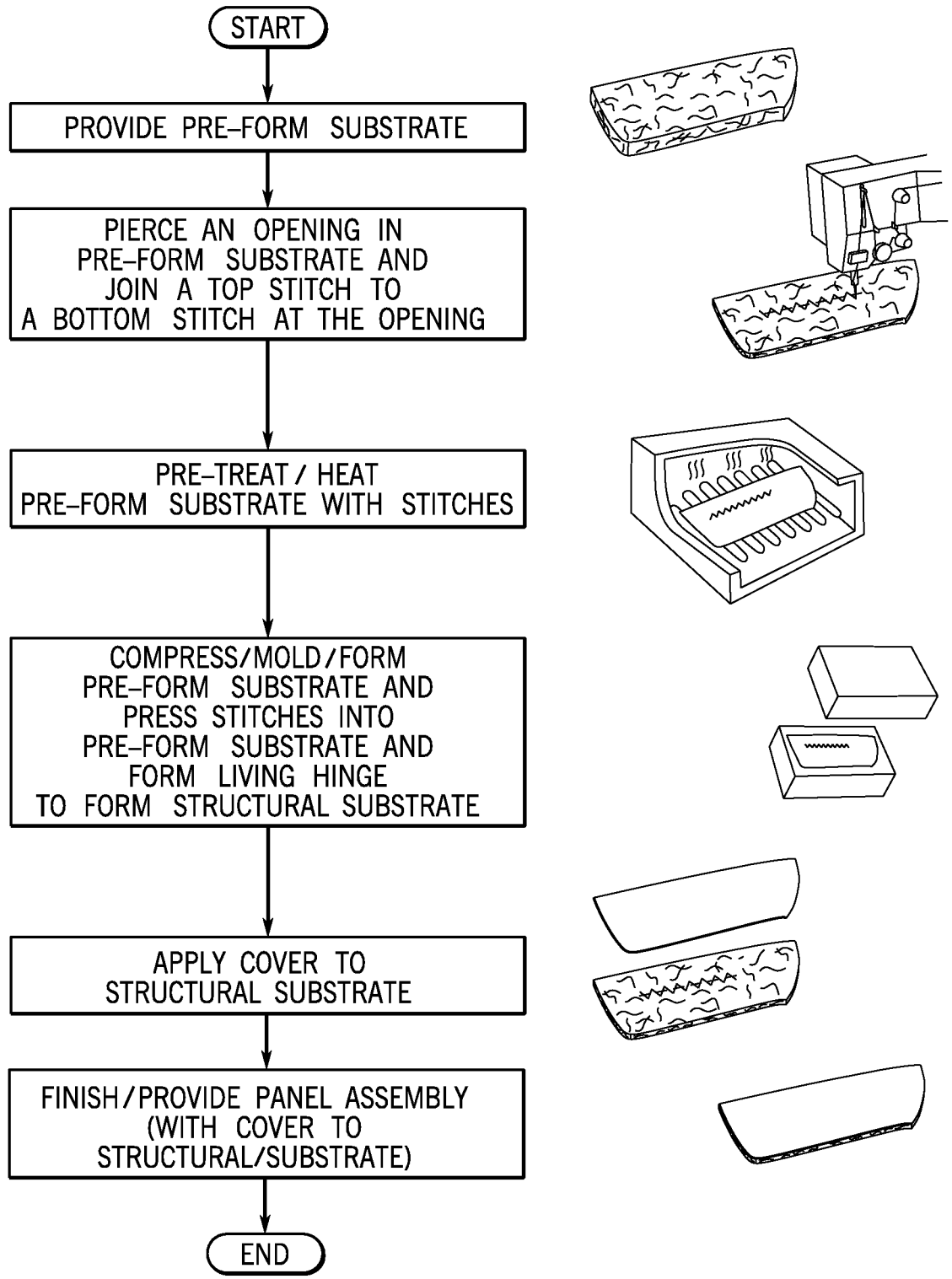
FIGS. 19 and 20 are schematic flow diagrams of a method for forming a vehicle interior component according to an exemplary embodiment.
Figure 20:
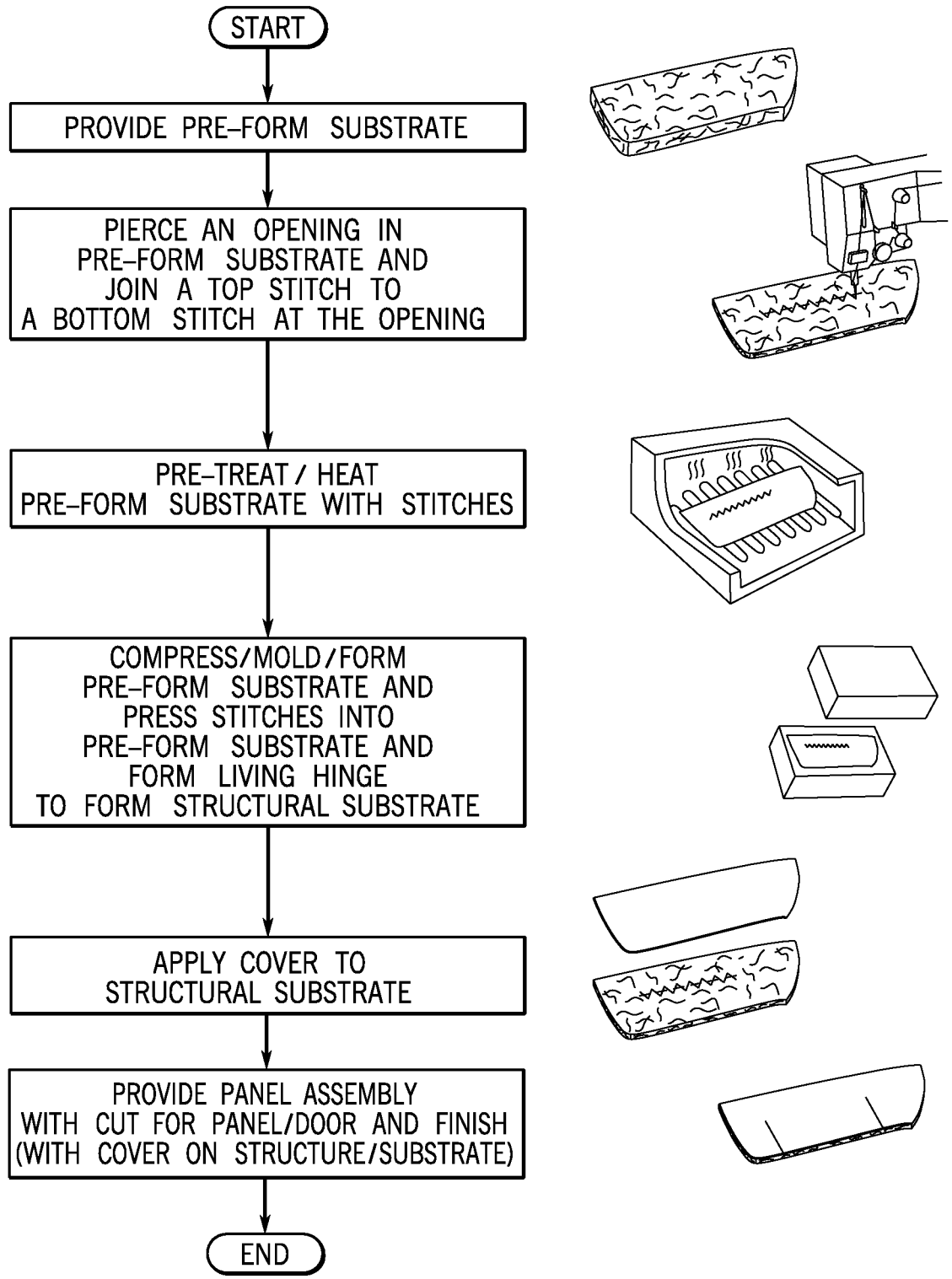

According to an exemplary embodiment as shown schematically in FIG. 15A, a fiber mat 202u may comprise a combination of fibers (e.g. natural and/or synthetic fibers) and thermoplastic resin (e.g. polypropylene (PP), acrylonitrile butadiene styrene (ABS), polycarbonate (PC), etc.). According to an exemplary embodiment as shown schematically in FIG. 15B, fiber mat 202u may be trimmed into a fiber mat 202t having a thickness. According to an exemplary embodiment, fiber mat 202t may be heated to induce the thermoplastic resin to liquefy. According to an exemplary embodiment as shown schematically in FIG. 15C, heated fiber mat 202t may be partially compressed into a fiber panel 202 having a thickness less than the thickness of fiber mat 202t. According to an exemplary embodiment as shown schematically in FIGS. 15D through 15F, a reinforcement T comprising at least one of (a) KEVLAR, (b) aramid, (c) nylon, (d) polyester, (e) thread, (f) ceramic fibers, (g) polymeric fibers, (h) synthetic fibers, (i) a stitch may be sewn to fiber panel 202 to form reinforced fiber panel 202r.

According to an exemplary embodiment as shown schematically in FIGS. 15A-15F, 16A-16E, 19 and 20, a method of manufacturing a vehicle trim component 1000 may comprise the steps of providing a fiber panel 202, joining a reinforcement T to fiber panel 202 in at least one hinge area to form a reinforced fiber panel 202r, disposing reinforced fiber panel 202r onto a first surface of a mold M, compressing reinforced fiber panel 202r between a first surface and a second surface of the mold to form reinforced fiber panel 202r into a structural substrate 200 having a shape and attaching a structure 100 on a side of the structural substrate. The shape may correspond to a first contour of the first surface and a second contour of the second surface. Structural substrate 200 may be configured to provide at least one panel/door. Reinforcement T may be configured to secure the panel/door to structural substrate 200.

According to an exemplary embodiment as shown schematically in FIG. 16A, reinforced fiber panel 202r may be heated in an oven OV. As shown schematically in FIG. 16B, heated reinforced fiber panel 202r may be transferred into a mold having a mold top MT and mold bottom MB. According to an exemplary embodiment as shown schematically in FIGS. 16C and 16D, a component shown as an instrument panel substrate 200 may be produced by a process of compression forming heated reinforced fiber panel 202r into a structural substrate 210 and injection molding resin onto compression formed heated reinforced fiber panel 202r. A recess 210r/RC of structural substrate 210 may be formed in the process. Recess 210r/RC may be configured to provide a living hinge for a door of structural substrate 210. Reinforcement T may be configured to secure the door to structural substrate 210 during movement (e.g. opening and/or closing) of the door.

According to an exemplary embodiment as shown schematically in FIG. 16E, instrument panel substrate 200 may provide a feature shown as a plastic rib 220 on a back side of structural substrate 210 to improve structural integrity and rigidity of structural substrate 210. Plastic rib 220 may comprise a reinforcement 100 to provide structural support. Plastic rib 220 may comprise a border to provide reinforcement and/or dimensional accuracy for structural substrate 210. According to an exemplary embodiment, plastic rib 220 may be placed at any location on structural substrate 210 (e.g. along an edge of structural substrate 210, in the middle of structural substrate 210, etc.). According to an exemplary embodiment, multiple plastic ribs 220 may be placed at various different locations on structural substrate 210. According to an exemplary embodiment, plastic rib 220 may improve structural integrity of instrument panel substrate 200. According to an exemplary embodiment as shown schematically in FIG. 16E, plastic rib 220 may form a honeycomb shaped pattern to improve structural integrity and rigidity. According to an exemplary embodiment, plastic rib 220 may be formed in any configuration according to a specific application (e.g. ancillary features for attaching air vents, speakers or infotainment system, etc.).

According to an exemplary embodiment as shown schematically in FIGS. 13A-13B, 14A-14B, 15A-15F, 16A-16E, 17A-17E, 18A-18D, 19 and 20, a trim component for a vehicle interior may comprise a structural substrate providing at least one panel/door. The structural substrate may comprise a reinforcement configured to secure the at least one panel/door to the structural substrate. The reinforcement may comprise a top stitch and a bottom stitch. The reinforcement may be comprised of bonded nylon thread. The reinforcement may be comprised of at least one of (a) KEVLAR, (b) aramid, (c) nylon, (d) polyester, (e) thread, (f) ceramic fibers, (h) polymeric fibers, (i) synthetic fibers. The structural substrate may comprise a panel comprised at least partially of fibers; the reinforcement may be comprised of thread sewn to the panel. Thread may be pressed into a surface of the panel during a compression forming process. The structural substrate may comprise at least one of (a) a compression-formed component; (b) a generally rigid fiber mat. The structural substrate may comprise a living hinge for the at least one door; the reinforcement may be positioned at the living hinge.

According to an exemplary embodiment as shown schematically in FIGS. 13A-13B, 14A-14B, 15A-15F, 16A-16E, 17A-17E, 18A-18D, 19 and 20, a vehicle interior component produced in a mold may comprise a first surface and a second surface by a process comprising placing a pre-form substrate onto the first surface of the mold, forming a compression-formed structure from the pre-form substrate by compressing the pre-form substrate between the first surface of the mold and the second surface of the mold and applying a cover to the compression-formed structure to form a panel assembly providing a surface effect. The compression-formed substrate may comprise a door and a living hinge for the door. The pre-form substrate may comprise a reinforcement for the living hinge. The pre-form substrate may comprise a fiber panel; the reinforcement may be comprised of thread sewn to the fiber panel. The compression-formed structure may comprise a substrate layer and the reinforcement. The step of forming the compression-formed structure may comprise forming the substrate layer into a generally rigid form. The step of forming the compression-formed structure may comprise forming the reinforcement and the pre-form substrate with a generally continuous surface. A generally smooth texture of the panel assembly may be provided by (a) a surface effect of the cover and (b) a surface effect of the pre-form substrate. The panel assembly may comprise a composite structure with at least partially a shape of the compression-formed structure; the shape may comprise a first contour provided by the first surface of the mold and a second contour provided by the second surface of the mold. The pre-form substrate may comprise a resin; the process may comprise the step of heating the pre-formed substrate and the pre-formed substrate may be compressed as the pre-formed substrate cools. The process may comprise the step of injecting resin into the mold after the compression-formed structure is formed to form an ancillary component of the panel assembly.

According to an exemplary embodiment as shown schematically in FIGS. 13A-13B, 14A-14B, 15A-15F, 16A-16E, 17A-17E, 18A-18D, 19 and 20, a component for a vehicle interior providing a hinged panel may comprise a composite structure comprising a structural substrate formed from a fiber panel and a cover for the structural substrate providing an exterior surface. The structural substrate may comprise a stitch pattern. The stitch pattern may comprise a thread. The composite structure may be configured so that the stitch pattern provides a reinforcement for the hinged panel so that the hinged panel remains at least partially attached to the composite structure when the hinged panel is rotated at a hinge. The stitch pattern may be provided on the fiber panel. The stitch pattern may be formed into the structural substrate so that the stitch pattern is not visible at the exterior surface of the cover. The set of threads of the stitch pattern may be pressed into a surface of the fiber panel so that the structural substrate comprises a generally flat surface for the cover. The thread may be pressed into a surface of the fiber panel so that the thread is not visible at the exterior surface of the cover of the composite surface. The thread may comprise a network of threads in the fiber panel formed into the structural substrate. The reinforcement may comprise threads for the stitch pattern comprising at least one of (a) KEVLAR, (b) aramid, (c) nylon, (d) polyester, (e) thread, (f) ceramic fibers, (g) polymeric fibers, (h) synthetic fibers; (i) bonded nylon. The hinged panel may be configured to remain at least partially attached to the composite structure by the thread. The stitch pattern may provide the reinforcement at a living hinge for the hinged panel. The thread may comprise a set of threads at least partially sewn into the fiber panel of the structural substrate. The component may comprise a feature on the structural substrate. The feature may comprise at least one of (a) a rib; (b) a set of ribs; (c) a feature adjacent to the reinforcement; (d) a feature at the reinforcement; (e) a feature at the hinged panel; (f) a structure for the hinged panel; (g) a resin-formed feature; (h) a resin-formed feature molded on the structural substrate. The composite structure further may comprise a foam layer beneath the cover. The structural substrate may comprise a compression-formed component from the fiber panel. The cover may comprise at least one of (a) leather; (b) synthetic leather; (c) imitation leather; (d) a composite of a plastic layer and textile backing; (e) a coated fabric; (f) polyvinyl-chloride coated fabric; (g) a woven fabric; (h) a non-woven fabric; (i) an applique; (j) vinyl; (k) a foil; (l) coating on the structural substrate; (m) paint on the structural substrate; (n) the exterior surface of the structural substrate. The component may comprise at least one of an instrument panel; a door panel; a trim panel; a trim component.

According to an exemplary embodiment as shown schematically in FIGS. 13A-13B, 14A-14B, 15A-15F, 16A-16E, 17A-17E, 18A-18D, 19 and 20, a component for a vehicle interior providing a hinged panel may comprise a composite structure comprising a structural substrate formed from a fiber panel providing the hinged panel and a cover for the structural substrate providing an exterior surface. The structural substrate may comprise a reinforcement. The reinforcement may be configured so that the hinged panel remains at least partially attached to the composite structure when the hinged panel is rotated at a living hinge.

According to an exemplary embodiment as shown schematically in FIGS. 13A-13B, 14A-14B, 15A-15F, 16A-16E, 17A-17E, 18A-18D, 19 and 20, a trim component for a vehicle interior may be prepared using a mold by a process comprising the steps of providing a pre-form substrate, joining a reinforcement to the pre-form substrate to form a reinforced pre-form substrate, disposing the reinforced pre-form substrate onto a first surface of the mold and compressing the reinforced pre-form substrate between the first surface and a second surface of the mold to form the reinforced pre-form substrate into a structural substrate having a shape and comprising a living hinge. The shape may correspond to a first contour of the first surface and a second contour of the second surface. The structural substrate may be configured to provide at least one hinged panel. The reinforcement may be configured to secure the at least one hinged panel to the structural substrate at the living hinge. The step of joining a reinforcement to the pre-form substrate may comprise sewing at least one of a thread or a stitch to the pre-form substrate. The step of joining a reinforcement to the pre-form substrate may comprise piercing an opening in the pre-form substrate and joining a stitch to the pre-form substrate at the opening.

According to an exemplary embodiment as shown schematically in FIGS. 13A-13B, 14A-14B, 15A-15F, 16A-16E, 17A-17E, 18A-18D, 19 and 20, a method of manufacturing a vehicle trim component may comprise the steps of providing a pre-form substrate, joining a reinforcement to the pre-form substrate to form a reinforced pre-form substrate, disposing the reinforced pre-form substrate onto a first surface of the mold; and compressing the reinforced pre-form substrate between the first surface and a second surface of the mold to form the reinforced pre-form substrate into a structural substrate having a shape and a living hinge. The shape may correspond to a first contour of the first surface and a second contour of the second surface. The structural substrate may be configured to provide at least one hinged panel. The reinforcement may be configured to secure the hinged panel to the structural substrate when the hinged panel is rotated at the living hinge.

Related Patent Documents—Incorporation by Reference

The present application incorporates by reference (a) U.S. patent application Ser. No. 13/595,741 titled "SYSTEM AND METHOD FOR MANUFACTURING A VEHICLE TRIM COMPONENT VIA CONCURRENT COMPRESSION FORMING AND INJECTION MOLDING" filed Aug. 27, 2012 (now U.S. Pat. No. 8,939,745); (b) U.S. patent application Ser. No. 13/846,529 titled "SYSTEM AND METHOD FOR MANUFACTURING A VEHICLE TRIM COMPONENT VIA CONCURRENT COMPRESSION FORMING AND INJECTION MOLDING" filed on Mar. 18, 2013 (now U.S. Pat. No. 9,149,961); (c) U.S. patent application Ser. No. 14/424,671 titled "SYSTEM AND METHOD FOR MOUNTING AN AIRBAG CHUTE ASSEMBLY WITHIN A VEHICLE TRIM COMPONENT" filed Feb. 27, 2015 (now U.S. Pat. No. 9,481,337); (d) U.S. patent application Ser. No. 14/808,938 titled "VEHICLE TRIM COMPONENT" filed Jul. 24, 2015 (now U.S. Pat. No. 10,118,325); (e) U.S. patent application Ser. No. 15/331,578 titled "TRIM COMPONENT FOR VEHICLE INTERIOR" filed Oct. 21, 2016 (now U.S. Pat. No. 10,093,268).

It is important to note that the present inventions (e.g. inventive concepts, etc.) have been described in the specification and/or illustrated in the FIGURES of the present patent document according to exemplary embodiments; the embodiments of the present inventions are presented by way of example only and are not intended as a limitation on the scope of the present inventions. The construction and/or arrangement of the elements of the inventive concepts embodied in the present inventions as described in the specification and/or illustrated in the FIGURES is illustrative only. Although exemplary embodiments of the present inventions have been described in detail in the present patent document, a person of ordinary skill in the art will readily appreciate that equivalents, modifications, variations, etc. of the subject matter of the exemplary embodiments and alternative embodiments are possible and contemplated as being within the scope of the present inventions; all such subject matter (e.g. modifications, variations, embodiments, combinations, equivalents, etc.) is intended to be included within the scope of the present inventions. It should also be noted that various/other modifications, variations, substitutions, equivalents, changes, omissions, etc. may be made in the configuration and/or arrangement of the exemplary embodiments (e.g. in concept, design, structure, apparatus, form, assembly, construction, means, function, system, process/method, steps, sequence of process/method steps, operation, operating conditions, performance, materials, composition, combination, etc.) without departing from the scope of the present inventions; all such subject matter (e.g. modifications, variations, embodiments, combinations, equivalents, etc.) is intended to be included within the scope of the present inventions. The scope of the present inventions is not intended to be limited to the subject matter (e.g. details, structure, functions, materials, acts, steps, sequence, system, result, etc.) described in the specification and/or illustrated in the FIGURES of the present patent document. It is contemplated that the claims of the present patent document will be construed properly to cover the complete scope of the subject matter of the present inventions (e.g. including any and all such modifications, variations, embodiments, combinations, equivalents, etc.); it is to be understood that the terminology used in the present patent document is for the purpose of providing a description of the subject matter of the exemplary embodiments rather than as a limitation on the scope of the present inventions.

It is also important to note that according to exemplary embodiments the present inventions may comprise conventional technology (e.g. as implemented and/or integrated in exemplary embodiments, modifications, variations, combinations, equivalents, etc.) or may comprise any other applicable technology (present and/or future) with suitability and/or capability to perform the functions and processes/operations described in the specification and/or illustrated in the FIGURES. All such technology (e.g. as implemented in embodiments, modifications, variations, combinations, equivalents, etc.) is considered to be within the scope of the present inventions of the present patent document.

The invention claimed is:

1. A component for a vehicle interior configured to provide a panel configured to be moved between a closed position and an open position comprising:
   a structural substrate comprising a base providing the panel and a hinge area for the panel; and
   a reinforcement for the panel at the hinge area;
   wherein the reinforcement comprises a stitch pattern configured to reinforce the hinge area during movement of the panel;
   wherein the hinge area comprises a hinge;
   wherein the hinge comprises material of the structural substrate and the reinforcement;
   wherein the panel of the base of the structural substrate comprises a fiber panel;
   wherein the stitch pattern of the reinforcement comprises thread sewn into the fiber panel;
   wherein the structural substrate comprises the fiber panel and thread sewn into the fiber panel as the reinforcement.

2. The component of claim 1 wherein the stitch pattern of the reinforcement comprises thread sewn into the structural substrate at the hinge area.

3. The component of claim 1 wherein the panel comprises a door.

4. The component of claim 1 wherein the structural substrate comprises a surface for the stitch pattern; and wherein the stitch pattern is pressed into the surface of the structural substrate.

5. The component of claim 1 wherein the structural substrate comprises at least one of (a) a compression-formed component; (b) a generally rigid fiber mat; (c) a fiber panel.

6. The component of claim 1 wherein the structural substrate comprises a base; wherein the panel is configured to be movable relative to the base; and wherein the reinforcement is configured to reinforce the panel to the base at the hinge.

7. The component of claim 1 further comprising a cover providing an exterior surface; wherein the stitch pattern is concealed at the exterior surface by the cover.

8. The component of claim 1 wherein the reinforcement is comprised of at least one of (a) KEVLAR, (b) aramid, (c) nylon, (d) polyester, (e) thread, (f) ceramic fibers, (g) polymeric fibers, (h) synthetic fibers.

9. The component of claim 1 comprising at least one of (a) an instrument panel; (b) a door panel; (c) a trim panel; (d) a trim component; (e) a trim component wherein the panel comprises a door; (f) a trim component wherein the panel comprises an airbag door.

10. A component for a vehicle interior configured to provide a panel configured to be moved between a closed position and an open position prepared in a mold providing a first mold surface and a second mold surface by a method comprising the steps of:
   (a) providing a substrate comprising a base;
   (b) forming the substrate with a hinge area so that the panel is configured to be movable relative to the base of the substrate at the hinge area;
   (c) joining a reinforcement in the substrate at the hinge area for the panel;
   (d) compressing the substrate between the first mold surface and the second mold surface of the mold to form a structural substrate having a shape;

wherein the shape of the structural substrate is formed at least partially by the first mold surface and the second mold surface;

wherein the reinforcement at the hinge area for the panel is configured to secure the panel to the base for movement between the closed position and the open position;

wherein the step of joining the reinforcement in the substrate comprises sewing a stitch pattern in the substrate;

wherein the substrate comprises a fiber panel;

wherein the stitch pattern of the reinforcement comprises thread sewn into the fiber panel;

wherein the structural substrate comprises the fiber panel and thread sewn into the fiber panel as the reinforcement.

11. The component of claim 10 wherein the hinge area comprises a hinge and the panel comprises a door.

12. The component of claim 11 wherein the hinge comprises a living hinge formed in the base of the substrate.

13. The component of claim 11 wherein the hinge comprises material from the substrate reinforced by the stitch pattern of the reinforcement.

14. The component of claim 10 wherein the hinge area comprises a recess in the substrate.

15. The component of claim 10 wherein the step of forming the substrate comprises at least partially cutting the panel from the base of the substrate and at least partially retaining material for a hinge for the panel at the hinge area.

16. The component of claim 10 wherein the substrate comprises a fiber panel.

17. The component of claim 10 further comprising the step of providing a cover layer on the substrate; wherein the stitch pattern of the reinforcement is at least partially concealed by the cover layer.

18. The component of claim 10 wherein joining the reinforcement in the substrate comprises sewing a stitch pattern in a surface of the substrate.

19. A component for a vehicle interior configured to provide a panel configured to be moved between a closed position and an open position comprising:

(a) a structural substrate formed from a fiber panel;

(b) a cover for the structural substrate providing an exterior surface;

wherein the structural substrate comprises a hinge for the panel and a stitch pattern at the hinge;

wherein the stitch pattern comprises thread sewn into the fiber panel;

wherein the stitch pattern is configured to provide a reinforcement at the hinge when the panel is rotated between the closed position and the open position;

wherein the structural substrate comprises the fiber panel and thread sewn into the fiber panel as the reinforcement.

20. The component of claim 19 wherein the stitch pattern is formed into the structural substrate so that the stitch pattern is not visible at the exterior surface of the cover.

* * * * *